United States Patent
Jang et al.

(10) Patent No.: US 11,569,471 B2
(45) Date of Patent: Jan. 31, 2023

(54) LIGHT EMITTING DEVICE (LED) AND MULTI-STACKED LED INCLUDING CHARGE GENERATION JUNCTION (CGJ) LAYER, AND MANUFACTURING METHOD THEREOF

(71) Applicant: UNIVERSITY-INDUSTRY COOPERATION GROUP OF KYUNG HEE UNIVERSITY, Yongin-si (KR)

(72) Inventors: Jin Jang, Seoul (KR); Jeong Gi Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 17/680,757

(22) Filed: Feb. 25, 2022

(65) Prior Publication Data
US 2022/0181574 A1 Jun. 9, 2022

Related U.S. Application Data

(62) Division of application No. 16/928,295, filed on Jul. 14, 2020, now Pat. No. 11,309,510.

(30) Foreign Application Priority Data

Jul. 15, 2019 (KR) .................. 10-2019-0085362

(51) Int. Cl.
*H01L 51/56* (2006.01)
*H01L 51/50* (2006.01)
(Continued)

(52) U.S. Cl.
CPC ........ *H01L 51/5056* (2013.01); *H01L 27/156* (2013.01); *H01L 51/502* (2013.01);
(Continued)

(58) Field of Classification Search
CPC ..................................... H01L 51/56
See application file for complete search history.

(56) References Cited

U.S. PATENT DOCUMENTS

| 2016/0079556 A1* | 3/2016 | Yoo | ..................... H01L 51/5072 257/40 |
|---|---|---|---|
| 2018/0062100 A1* | 3/2018 | Xu | ..................... H01L 51/5278 |

(Continued)

FOREIGN PATENT DOCUMENTS

| KR | 10-1772437 B1 | 8/2017 |
| KR | 10-1812896 B1 | 12/2017 |
| KR | 101812896 B1 * | 12/2017 |

OTHER PUBLICATIONS

Communication dated Sep. 15, 2020, issued by the Korean Patent Office in counterpart Korean Application No. 10-2019-0085362.
(Continued)

*Primary Examiner* — Caleb E Henry
(74) *Attorney, Agent, or Firm* — Sughrue Mion, PLLC

(57) ABSTRACT

Provided is a light emitting diode (LED) and a multi-stacked LED including a charge generation junction (CGJ) layer, and a manufacturing method thereof. An LED including an anode, a hole transport layer, a light emitting layer, and a cathode, includes a CGJ layer in a layer-by-layer structure in which an n-type oxide and a p-type oxide formed on at least one surface of the light emitting layer are sequentially stacked. Here, the n-type oxide includes zinc oxide (ZnO) and the p-type oxide is represented by the following Formula: $Cu_2Sn_{2-x}S_3$—$(Ga_x)_2O_3$. Here, $0.2 < x < 1.5$.

5 Claims, 41 Drawing Sheets

(51) Int. Cl.
H01L 51/52 (2006.01)
H01L 27/15 (2006.01)

(52) U.S. Cl.
CPC ...... *H01L 51/5206* (2013.01); *H01L 51/5221* (2013.01); *H01L 51/56* (2013.01); *H01L 2251/303* (2013.01)

(56) References Cited

U.S. PATENT DOCUMENTS

| | | | |
|---|---|---|---|
| 2018/0286927 A1* | 10/2018 | Xiao | H01L 27/3225 |
| 2019/0097150 A1* | 3/2019 | Yuan | H01L 51/502 |
| 2019/0214594 A1* | 7/2019 | Jang | H01L 51/5278 |

OTHER PUBLICATIONS

Jeonggi Kim et al., "High Hall Mobility P-type $Cu_2SnS_3$—$Ga_2O_3$ with a High Work Function", Advanced Functional Materials, 2018, vol. 28, 1802941, pp. 1-9.

* cited by examiner

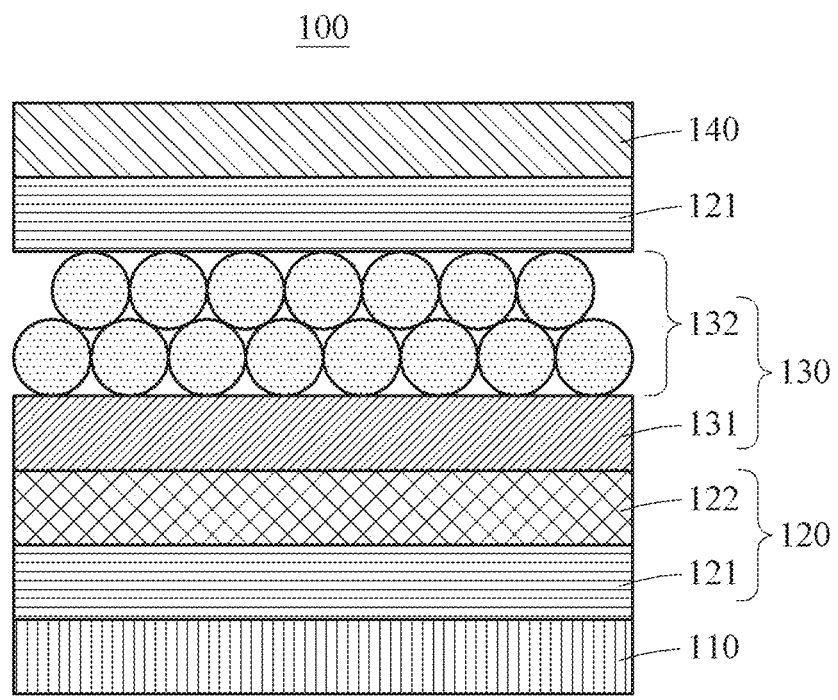

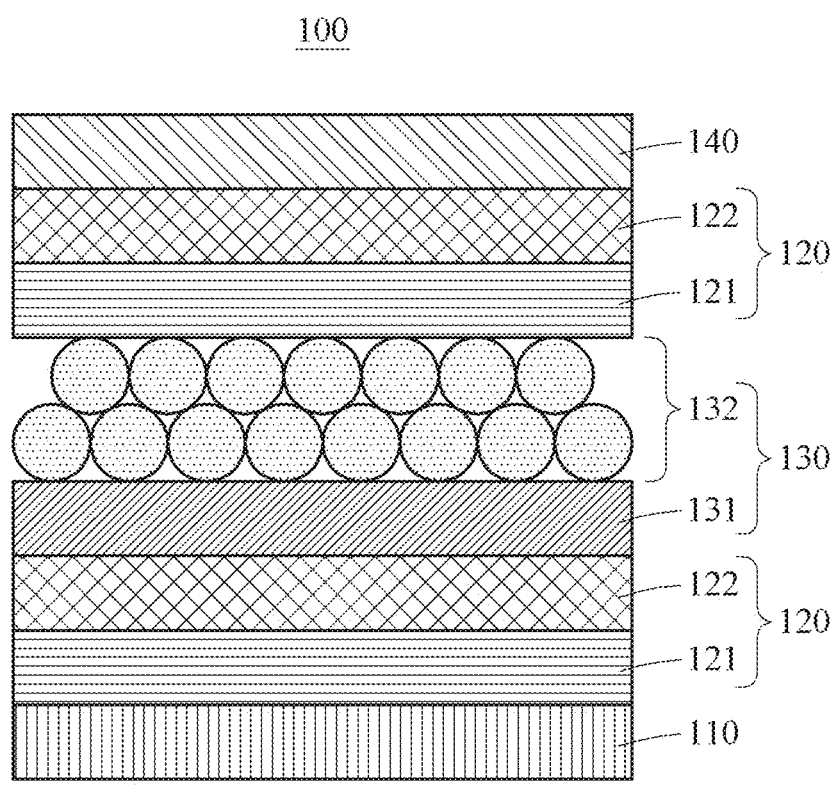

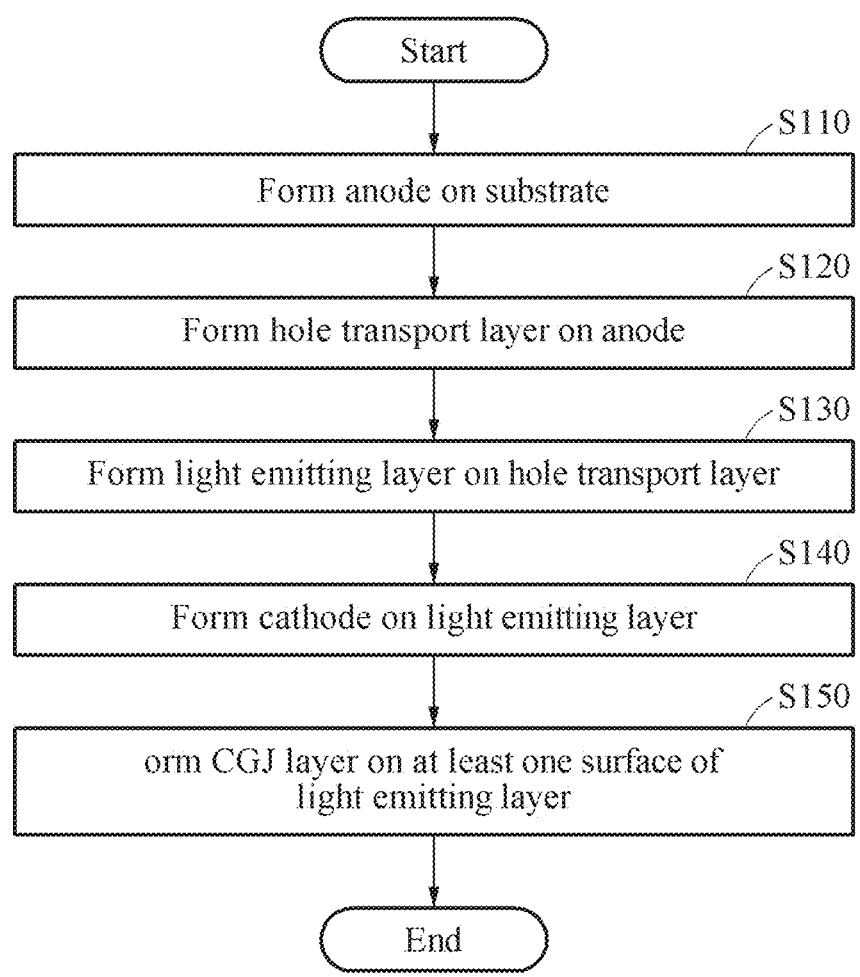

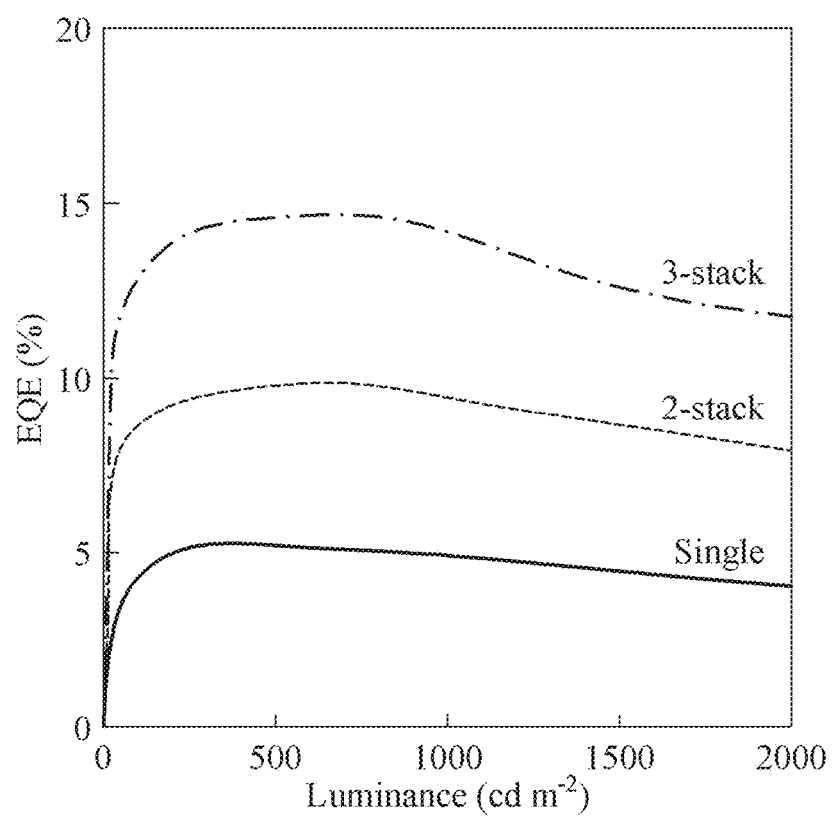

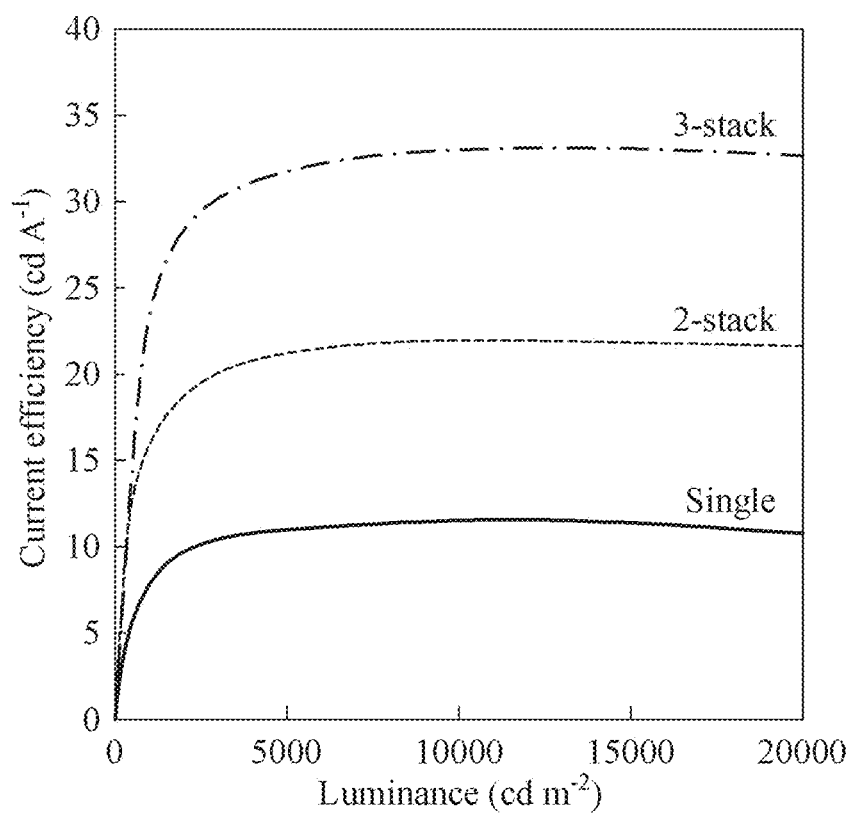

LIGHT EMITTING DEVICE (LED) AND MULTI-STACKED LED INCLUDING CHARGE GENERATION JUNCTION (CGJ) LAYER, AND MANUFACTURING METHOD THEREOF

CROSS-REFERENCE TO RELATED APPLICATION

This application is a Divisional Application of U.S. application Ser. No. 16/928,295, filed on Jul. 14, 2020, which claims priority from and the benefit of Korean Patent Application No. 10-2019-0085362 filed on Jul. 15, 2019, which is hereby incorporated by reference in its entirety.

BACKGROUND

1. Field

The following description of embodiments relates to a light emitting device (LED) and a multi-stacked LED including a charge generation junction (CGJ) layer, and a manufacturing method thereof.

2. Related Art

Currently, a quantum dot emitting diode (QLED) is in the spotlight due to excellent properties, such as, for example, variable color emission, wide color gamut, and low manufacturing cost.

Since the QLED was first release in 1994, device performance has been continuously improved with the development of high quality quantum dot (QD) materials and device architectures.

Further, the current efficiency (CE) and external quantum efficiency (EQE) of the QLED are similar to those of a state-of-the-art organic light emitting diode (OLED) and accordingly, the QLED is expected to be commercialized as one of next-generation displays.

However, despite the great improvement in the device efficiency, the operation life of the QLED is much less than that of a commercial OLED.

A series structure that connects two or three electroluminescent (EL) devices in series using a charge generation junction (CGJ) provides high CE and long operation life, and is widely used for an OLED display and lighting.

According to the related art, CGJ formed through a solution process includes a p-type semi-continuous polymer, such as a conductive polymer PEDOT:PSS, and an n-type metal oxide, such as zinc oxide (ZnO) and ZnO doped with lithium (Li).

However, acidic properties of PEDOT:PSS cause damage to the surface of indium tin oxide (ITO) and degrade CGJ properties and device performance in reaction to ZnO.

It is well known that inorganic p-type materials, such as $Cu_2O$, NiOx, Cu:NiOx, WOx, and CuSCN, may be used as a hole injection layer of QLED instead of using a hole injection layer that includes PEDOT:PSS.

However, most hole injection layers including metal oxides generally require a long-hour and high-temperature annealing process to acquire the adequate transparency and conductivity and some p-type metal oxides require subsequent UV-ozone treatment.

Such high-temperature annealing and ultraviolet (UV)/$O_3$ treatment may degrade a quantum dot function of the QLED.

REFERENCES

Patent document 1: Korean Patent Registration No. 10-1812896, "quantum dot light emitting device including solution processed charge generation junction and manufacturing method thereof"

Patent document 2: Korean Patent Registration No. 10-1772437, "light emitting device fabricated utilizing charge generation layer formed by solution process and fabrication method thereof"

SUMMARY

An embodiment provides a light emitting diode (LED) having an excellent capability of generating and transporting charge by including a charge generation junction (CGJ) layer formed using an n-type oxide and a p-type oxide different from conventional PEDOT:PSS.

An embodiment also provides an LED having the excellent current efficiency (CE) and external quantum efficiency (EQE) by forming a CGJ layer having an excellent capability of generating and transporting charge.

An embodiment also provides a multi-stacked LED having an improved capability of generating and transporting charge and improved electrical properties by forming a CGJ layer between light emitting layers in the multi-stacked LED including at least two light emitting layers.

An embodiment also provides a method of manufacturing an LED that may perform a manufacture on a large scale by forming a CGJ layer through a solution process and by reducing a process time and may prevent damage to a device by proceeding at a low temperature.

According to an aspect, there is provided an LED including an anode, a hole transport layer, a light emitting layer, and a cathode, the LED including a charge generation junction (CGJ) layer in a layer-by-layer structure in which an n-type oxide and a p-type oxide formed on at least one surface of the light emitting layer are sequentially stacked. Here, the n-type oxide includes zinc oxide (ZnO), and the p-type oxide is represented by the following formula:

$$Cu_2Sn_{2-X}S_3\text{—}(Ga_X)_2O_3 \qquad \text{[Formula]}$$

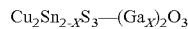

Here, $0.2 < x < 1.5$.

The n-type oxide and the p-type oxide may have the band gap energy of 3.0 eV or more.

The n-type oxide may be ZnO doped with a dopant.

The dopant may include at least one of cesium (Cs), lithium (Li), aluminum (Al), magnesium (Mg), indium (In), and gallium (Ga).

The light emitting layer may include at least one of a quantum dot, an oxide layer, a nitride layer, a semiconductor layer, an organic compound layer, an inorganic compound layer, a phosphor layer, and a dye layer.

The LED may have the current efficiency (CE) of 1 cd/A to 100 cd/A.

The LED may have the external quantum efficiency (EQE) of 5% to 25%.

According to an aspect, there is provided a multi-stacked LED including an anode, a hole transport layer, at least two light emitting layers, and a cathode, the multi-stacked LED including a CGJ layer in which a layer-by-layer structure in which an n-type oxide and a p-type oxide are sequentially stacked is formed between the at least two light emitting layers. Here, the n-type oxide includes zinc oxide (ZnO), and the p-type oxide is represented by the following formula:

$$Cu_2Sn_{2-X}S_3\text{—}(Ga_X)_2O_3 \qquad \text{[Formula]}$$

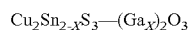

Here, $0.2 < x < 1.5$.

The n-type oxide and the p-type oxide may have the band gap energy of 3.0 eV or more.

The n-type oxide may be ZnO doped with a dopant.

The dopant may include at least one of cesium (Cs), lithium (Li), aluminum (Al), magnesium (Mg), indium (In), and gallium (Ga).

The multi-stacked LED may have the current efficiency (CE) of 3 cd/A to 300 cd/A.

The multi-stacked LED may have the external quantum efficiency (EQE) of 15% to 75%.

According to an aspect, there is provided a method of manufacturing an LED, the method including forming an anode on a substrate; forming a hole transport layer on the anode; forming a light emitting layer on the hole transport layer; forming a cathode on the light emitting layer; and forming a CGJ layer on at least one surface of the light emitting layer. Here, the CGJ layer is formed through film formation with a solution that includes an n-type oxide including zinc oxide (ZnO) and a p-type oxide represented by the following formula:

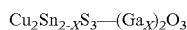
[Formula]

Here, 0.2<x<1.5.

The CGJ layer may be applied with heat treatment or ultraviolet (UV)/ozone treatment.

The heat treatment may be performed at 150° C. to 250° C.

The heat treatment may be performed for 10 minutes to 90 minutes.

The UV/ozone treatment may be performed for 30 seconds to 5 minutes.

According to some embodiments, it is possible to provide an LED having an excellent capability of generating and transporting charge by including a CGJ layer formed using an n-type oxide and a p-type oxide different from conventional PEDOT:PSS.

According to some embodiments, it is possible to provide an LED having the excellent current efficiency (CE) and external quantum efficiency (EQE) by forming a CGJ layer having an excellent capability of generating and transporting charge.

According to some embodiments, it is possible to provide a multi-stacked LED having an improved capability of generating and transporting charge and improved electrical properties by forming a CGJ layer between light emitting layers in a multi-stacked LED including at least two light emitting layers.

According to some embodiments, it is possible to provide a method of manufacturing an LED that may perform a manufacture on a large scale by forming a CGJ layer through a solution process and by reducing a process time and may prevent damage to a device by proceeding at a low temperature.

Further areas of applicability will become apparent from the description provided herein. The description and specific examples in this summary are intended for purposes of illustration only and are not intended to limit the scope of the present disclosure.

BRIEF DESCRIPTION OF THE FIGURES

Embodiments will be described in more detail with regard to the figures, wherein like reference numerals refer to like parts throughout the various figures unless otherwise specified, and wherein:

FIGS. 1B to 1D are cross-sectional views illustrating an overall structure of an LED according to an embodiment.

FIG. 5 is a flowchart illustrating a process of manufacturing an LED according to an embodiment.

FIG. 10D is a graph showing an external quantum efficiency-luminance curve of a blue LED and a multi-stacked blue LED according to an embodiment.

FIG. 12C is a graph showing a current efficiency-luminance curve of a red LED and a multi-stacked red LED according to an embodiment.

DETAILED DESCRIPTION

Figure 1A:
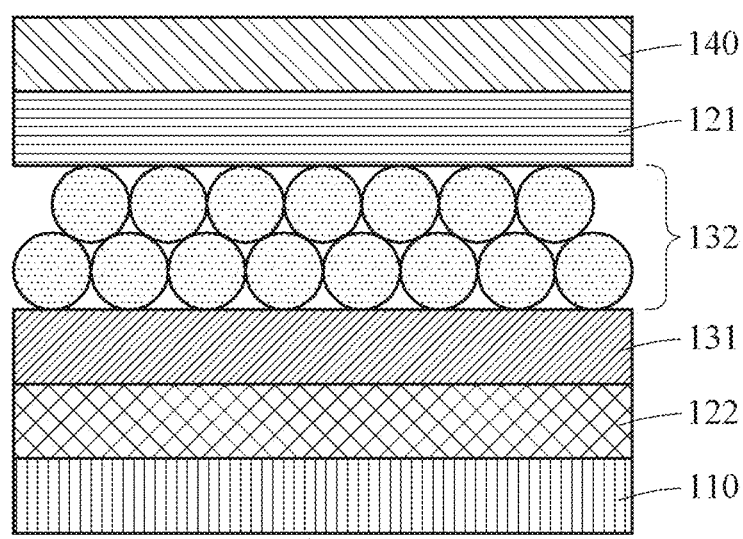
FIG. 1A is a cross-sectional view illustrating a detailed structure of a conventional light emitting device (LED)

The following structural or functional descriptions of embodiments described herein are merely intended for the purpose of describing the embodiments described herein and may be implemented in various forms. Here, the examples are not construed as limited to the disclosure and should be understood to include all changes, equivalents, and replacements within the idea and the technical scope of the disclosure.

Various modifications and changes may be made to the present disclosure and the disclosure may include various embodiments. Specific embodiments are described in detail with reference to the accompanying drawings. The embodiments, however, may be embodied in various different forms, and should not be construed as being limited to only the specific embodiments. Rather, the embodiments should be understood to include all of the modifications, equivalents, and substitutions included in the spirit and technical scope of the disclosure.

Although the terms "first," "second," etc., may be used herein to describe various components, the components should not be limited by these terms. These terms are only used to distinguish one component from another component. For example, a first component may also be termed a second component and, likewise, a second component may be termed a first component, without departing from the scope of this disclosure.

Hereinafter, embodiments are described with reference to the accompanying drawings, however, the present disclosure is not limited thereto or restricted thereby.

The terms used herein are used to simply explain specific embodiments and are not construed to limit the present disclosure. The singular forms "a," "an," and "the," are intended to include the plural forms as well, unless the context clearly indicates otherwise. It will be further understood that the terms "comprises/comprising" and "has/having" when used in this specification, specify the presence of stated features, integers, steps, operations, elements, and/or components, but do not preclude the presence or addition of one or more other features, integers, steps, operations, elements, components, and/or groups, thereof. Also, the terms "embodiment," "example," "aspect," etc., should not be interpreted that any described aspect or design is excellent or advantageous than other aspects or designs.

Also, the term "or" refers to "inclusive or" rather than "exclusive or." That is, unless indicated otherwise, or unless the context clearly indicates otherwise, the representation "x uses a or b" represents one of natural inclusive permutations.

Also, the singular forms "a," "an," and "the" used in the present specification and claims, should be interpreted to generally indicate "at least one," unless the context clearly indicates otherwise.

Although the terms used in the following description are selected from general and common ones in the related art, there may be other terms based on technical development and/or change, custom, preference of those skilled in the art, and the like. Therefore, the terms used in the following description are not construed to limit the technical spirit and should be understood as exemplary terms to explain the embodiments.

Also, in a specific case, some terms may be arbitrarily selected by the applicant. In this case, the meaning thereof will be described in detail in the corresponding detailed description. Accordingly, the terms used in the following description should be understood based on the meaning of the term and the overall content of the specification, not merely a name of the term.

Unless otherwise defined, all terms (including technical and scientific terms) used herein have the same meaning as commonly understood by those skilled in the art to which the present disclosure pertains. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

When it is determined that detailed description related to a known function or configuration may make the embodiments ambiguous in describing the embodiments, the detailed description may be omitted. Also, the terms used herein are used to appropriately express the embodiments and may vary based on the intent of an operator or custom of the field to which the disclosure pertains. Accordingly, the definition of the terms may be made based on the overall description of the present specification.

A light emitting device (LED) according to an embodiment includes a charge generation junction (CGJ) that includes an n-type oxide and a p-type oxide. The CGJ layer may generate a hole and an electron and may also transport a hole and an electron and thus, may achieve high current efficiency and external quantum efficiency.

Herein, the term "LED" refers to an LED equipped with a single electroluminescent (EL) unit that includes a light emitting layer and a hole transport layer and the term "multi-stacked LED" refers to an LED that includes at least two EL units.

Hereinafter, a structure and a principle of an LED according to an embodiment is described with reference to the accompanying drawings.

Figure 1B:
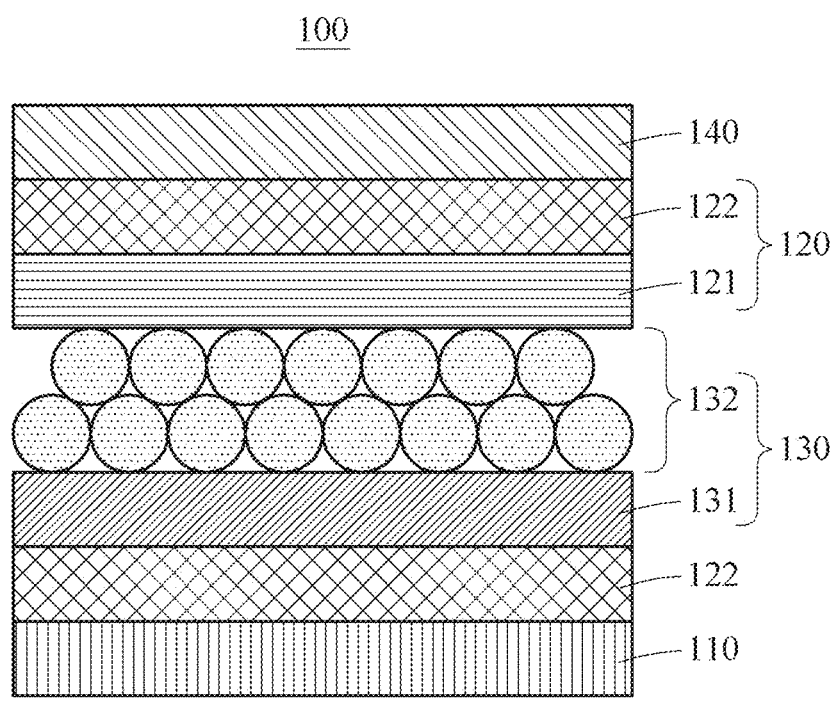

FIG. 1A is a cross-sectional view illustrating a detailed structure of a conventional light emitting device (LED), and FIGS. 1B to 1D are cross-sectional views illustrating an overall structure of an LED according to an embodiment.

Referring to FIGS. 1A to 1D, a conventional LED 100 includes a substrate (not shown), an anode 110, a hole injection layer, a hole transport layer 131, a light emitting layer 132, an electron transport layer, and a cathode 140, and an LED 100 according to an example embodiment includes a substrate, an anode 110, a hole transport layer 131, a light emitting layer 132, and a cathode 140, and here, may include a charge generation junction (CGJ) layer 120 in a layer-by-layer structure in which an n-type oxide 121 and a p-type oxide 122 are sequentially stacked on at least one surface of a light emitting layer 132.

In detail, referring to FIGS. 1B to 1D, the CGJ layer 120 according to an embodiment may be formed between the light emitting layer 132 and the cathode 140 or between the light emitting layer 132 and the anode 110, and may also be formed on both surfaces of the light emitting layer 132 depending on embodiments.

The substrate refers to a base substrate for forming the LED 100. A material of the substrate used in this field is not particularly limited. For example, various materials, such as silicone, glass, plastic, and metal foil, may be used.

For example, a plastic substrate may include polyethylene terephthalate (PET), polyethylenenaphthelate (PEN), polypropylene (PP), polycarbonate (PC), polyimide (PI), tri acetyl cellulose (TAC) and polyethersulfone (PES), and a flexible substrate including one of aluminum foil and stainless-steel foil may be used.

The anode 110 is formed on the substrate (not shown) and refers to an electrode that provides electrons to the LED 100 according to an example embodiment.

Depending on embodiments, the anode 110 may be formed through a solution process, such as screen printing, using a transmissive electrode, a reflective electrode, metal paste, or a metal ink material that is in a colloid state in a predetermined liquid.

A material for the transmissive electrode may include at least one of indium tin oxide (ITO), indium zinc oxide (IZO), tin oxide ($SnO_2$), zinc oxide (ZnO), metal oxide/metal/metal oxide multilayer, graphene, and carbon nanotube, which are transparent and highly conductive.

A material for the reflective electrode may include at least one of magnesium (Mg), aluminum (Al), silver (Ag), Ag/ITO, Ag/IZO, aluminum-lithium (Al—Li), calcium (Ca), magnesium-indium (Mg—In), and magnesium-silver (Mg—Ag).

The metal paste may be one of silver (Ag) paste, aluminum (Al) paste, gold (Au) paste, and copper (Cu) paste materials, or alloy thereof.

The metal ink material may include at least one of silver (Ag) ink, silver (Ag) ink, aluminum (Al) ink, gold (Au) ink, calcium (Ca) ink, magnesium (Mg) ink, lithium (Li) ink, and cesium (Cs) ink, and a metal material contained in the metal ink material may be in an ionized state in a solution.

An EL unit 130 including the hole transport layer 131 and the light emitting layer 132 may be formed on the anode 110 according to an embodiment.

The hole transport layer 131 refers to a layer configured to transport holes to the light emitting layer 132, and may be formed through a hole deposition process or a solution process using an organic material or an inorganic material.

The hole transport layer 131 may effectively transport holes to the light emitting layer 132, and density of holes and electrons may be balanced in the light emitting layer 132, which may lead to improving the luminous efficiency of the LED 100.

Also, electrons injected from the cathode 140 to the light emitting layer 132 are trapped in the light emitting layer 132 due to an energy barrier present in an interface between the hole transport layer 131 and the light emitting layer 132 and accordingly, a rebinding probability of electrons and holes increases, which may lead to improving the luminous efficiency of the LED 100.

Further, the hole transport layer 131 is formed between the light emitting layer 132 and the CGJ layer 120, which further improves the effect of the CGJ layer 120.

The hole transport layer 131 may be formed using, for example, PEDOT:PSS, may be formed by mixing additives, such as tungsten oxide ($WO_3$), graphene oxide (GO), carbon nanotube (CNT), molybdenum oxide (MoOx), vanadium oxide ($V_2O_5$), and nickel oxide (NiOx), to PEDOT:PSS, may be formed using an organic material such as PVK (poly(9-vinylcarbazole)), or without being limited thereto, may be formed using various organic materials or inorganic materials.

In the light emitting layer 132, holes injected from the anode 110 and electrons injected from the cathode 140 meet and form exciton and the exciton may cause light with a specific wavelength to be generated.

The light emitting layer 132 may include one of a quantum dot, an oxide layer, a nitride layer, a semiconductor layer, an organic compound layer, an inorganic compound layer, a phosphor layer, and a dye layer.

Desirably, the light emitting layer 132 may be the quantum dot light emitting layer 132 that includes a quantum dot or may be the organic light emitting layer 132 that includes an organic compound.

If the light emitting layer 132 is the quantum dot light emitting layer 132, the quantum dot light emitting layer 132 may use at least one semiconductor material selected from a group including group II-VI semiconductor compounds, group III-V semiconductor compounds, group IV-VI semiconductor compounds, group IV elements or compounds, and combinations thereof.

The group II-VI semiconductor compounds may use at least one material selected from a group including binary compounds selected from a group including CdSe, CdS, ZnS, CdTe, ZnSe, ZnTe, ZnO, HgS, HgSe, HgTe, and mixtures thereof, ternary compounds selected from a group including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and mixtures thereof, and quaternary compounds selected from a group including CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V semiconductor compounds may use at least one material selected from a group including binary compounds selected from a group including GaN, GaP, GaAs, GaSb, AlP, AlAs, AlSb, InN, InP, InAs, InSb, and mixtures thereof, ternary compounds selected from a group including GaNP, GaNAs, GaNSb, GaPAs, GaPSb, AlNP, ANAs, AlNSb, AlPAs, AlPSb, InNP, InNAs, InNSb, InPAs, InPSb, GaAlNP, and mixtures thereof, and quaternary compounds selected from a group including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI semiconductor compounds may use at least one material selected from a group including binary compounds selected from a group including SnS, SnSe, SnTe, PbS, PbSe, PbTe, and mixtures thereof, ternary compounds selected from a group including SnSeS, SnSeTe, SnSTe, PbSeS, PbSeTe, PbSTe, SnPbS, SnPbSe, SnPbTe, and mixtures thereof, quaternary compounds selected from a group including SnPbSSe, SnPbSeTe, SnPbSTe, and mixtures thereof.

The group IV elements or compounds may use at least one material selected from a group including element compounds selected from a group including Si, Ge, and mixtures thereof and binary compounds selected from a group including SiC, SiGe, and mixtures thereof.

Depending on embodiments, the quantum dot light emitting layer 132 may use, desirably, CdSe/CdS/ZnS.

The cathode 140 refers to an electrode configured to provide electrons to the LED 100 according to an embodiment and may use, for example, a metal material, an ionized metal material, an alloy material, a metal ink material that is in a colloid state in a predetermined liquid, and transparent metal oxide.

In detail, for example, the metal material may use at least one of lithium (Li), magnesium (Mg), aluminum (Al), aluminum-lithium (Al—Li), calcium (Ca), magnesium-indium (Mg—In), magnesium-silver (Mg—Ag), platinum (Pt), gold (Au), nickel (Ni), copper (Cu), barium (Ba), silver (Ag), indium (In), ruthenium (Ru), lead (Pd), rhodium (Rh), iridium (Ir), osmium (Os) and cesium (Cs). Also, carbonate (C), conductive polymers, or combinations thereof may be used for the metal material.

The transparent metal oxide may include at least one of indium tin oxide (ITO), fluorine-doped tin oxide (FTO), antimony tin oxide (ATO) and aluminum doped zinc oxide (AZO).

Although the ITO is generally used as a material that forms the anode 110, the ITO may be used as a material for forming the cathode 140 and may form the transparent cathode 140 in an inverted solar cell structure.

The LED 100 according to an embodiment may simultaneously perform the functionality of hole injection and electron injection by including the CGJ layer 120 capable of performing the hole injection or electron injection functionality without including a separate hole injection layer or electron injection layer.

The CGJ layer 120 according to an embodiment may be formed using a solution process. The solution process may enable a large-scale process, may save a process time, and may relieve constraints on semiconductor properties of the anode 110 and the cathode 140.

The LED 100 according to an embodiment may include the CGJ layer 120 in a layer-by-layer structure in which the n-type oxide 121 and the p-type oxide 122 are sequentially stacked on at least one surface of the light emitting layer 132.

In detail, the CGJ layer 120 may be formed between the light emitting layer 132 and the cathode 140 as illustrated in FIG. 1B, and may be formed between the light emitting layer 132 and the anode 110 as illustrated in FIG. 1C.

Depending on embodiments, as illustrated in FIG. 1D, the CGJ layer 120 may be formed on both surfaces of the light emitting layer 132, that is, between the light emitting layer 132 and the cathode 140 and between the light emitting layer 132 and the anode 110.

In the CGJ layer 120, the n-type oxide 121 and the p-type oxide 122 are formed in a layer-by-layer structure. Therefore, electrons may be tunneled from highest occupied molecular orbital (HOMO) to lowest unoccupied molecular orbital (LUMO) due to band bending.

Such tunneling may supply charge carriers (electrons or holes) to the LED 100. Referring to FIG. 1B, charge carriers supplied from the CGJ layer 120 present between the light emitting layer 132 and an intaglio may be electrons.

The effect similar to the effect of containing a metal between electrodes, for example, the cathode 140 and the anode 110 may be achieved in that the CGJ layer 120 supplies charge carriers.

Injecting electrons from the cathode 140 may decisively depend on a work function of a material of the cathode 140. Here, cleaning the cathode 140 or preparing the surface of the cathode 140 before forming the cathode 140 may have a strong impact on the work function of the cathode 140, which may lead to causing a strong impact on the injection barrier.

Accordingly, the CGJ layer 120 formed in the LED 100 in the structure of FIG. 1B may improve charge injection properties of the LED 100 by separating the charge injection properties of the LED 100 from the work function of the cathode 140.

If the n-type oxide 121 and the p-type oxide 122 constituting the CGJ layer 120 according to an embodiment have the band gap energy of 3.0 eV or more, any type of materials may be used.

If the n-type oxide 121 and the p-type oxide 122 have the band gap energy of less than 3.0 eV, charge generation junction (CGJ) is impossible due to an insufficient band gap.

The n-type oxide 121 according to an embodiment is a material that includes zinc oxide and, depending on embodiments, may be zinc oxide doped with a dopant.

The dopant may include at least one of cesium (Cs), lithium (Li), aluminum (Al), magnesium (Mg), indium (In), and gallium (Ga).

The dopant may be contained in the zinc oxide at 0.1 atomic % to 50 atomic %.

If the content of the dopant is 0.1 atomic % or less, the sufficient doping effect may not be exhibited in that a small amount is added. Also, if the content of the dopant exceeds 50 atomic %, properties of the n-type oxide 121 may be degraded and charge generation may decrease.

The n-type oxide 121 may be generated in at least one of a sol-gel form and a nanoparticle form.

Depending on embodiments, the p-type oxide 122 used for the CGJ layer 120 may use PEDOT:PSS, which is generally used, or PEDOT:PSS mixed with additives. The additives may be a material that includes at least one of graphene oxide (GO), carbon nanotube (CNT), vanadium oxide ($V_2O_5$), tungsten oxide ($WO_3$), and polyoxyethylene tridecyl ether (PTE).

The p-type oxide 122 used for the CGJ layer 120 according to an embodiment may be a material represented by the following Formula.

$$Cu_2Sn_{2-X}S_3\text{—}(Ga_X)_2O_3 \quad \text{[Formula]}$$

Here, 0.2<x<1.5.

PEDOT:PSS that is conventionally used for the p-type oxide 122 is acidic and thus, causes damage on the electrode surface and reacts with the zinc oxide contained in the n-type oxide 121 to degrade the charge generation and transport properties of the CGJ layer 120 and electrical performance of the LED 100.

Dissimilar to PEDOT:PSS, the p-type oxide 122 represented by the above Formula does not damage the anode 110 or the cathode 140 and does not react to the n-type oxide 121, which may lead to improving the charge generation and transport properties and to allowing the LED 100 to have the excellent electrical performance.

The p-type oxide 122 may be formed by manufacturing a precursor solution that includes Cu, S, M (M is one more compounds selected from SnO, ITO, IZTO, IGZO, and IZO), and Ga, by applying the precursor solution over the substrate on which the anode 110 is formed to form a coating layer, and then by thermally treating the coating layer.

Depending on embodiments, referring to FIG. 1B, when the CGJ layer 120 is formed between the light emitting layer 132 and the anode 110, the LED 100 according to an embodiment may include an electron transport layer between the light emitting layer 132 and the cathode 140.

The electron transport layer is formed between the light emitting layer 132 and the cathode 140 and serves to easily transport electrons generated from the cathode 140 to the light emitting layer 132.

The electron transport layer may include at least one of fullerene (C60), fullerene derivatives, perylene, TPBi (2,2', 2"-(1,3,5-benzinetriyl)-tris(1-phynyl-1-H-benzimidazole)), polybenzimidazole (PBI), and PTCBI (3,4,9,10-perylene-tetracarboxylic bis-benzimidazole), naphthalene diimide (NDI) and derivatives thereof, $TiO_2$, $SnO_2$, ZnO, $ZnSnO_3$, 2,4,6-Tris(3-(pyrimidin-5-yl)phenyl)-1,3,5-triazine, 8-Hydroxyquinolinolato-lithium, 1,3,5-Tris(1-phenyl-1Hbenz-imidazol-2-yl)benzene, 6,6'-Bis[5-(biphenyl-4-yl)-1,3,4-oxadiazo-2-yl]-2,2'-bipyridyl, 4,4'-Bis(4,6-diphenyl-1,3,5-triazin-2-yl)biphenyl(BTB), rubidium carbonate ($Rb_2CO_3$), and rhenium (VI) oxide ($ReO_3$). The fullerene derivatives may be PCBM ((6,6)-phenyl-C61-butyric acid-methylester) or PCBCR ((6,6)-phenyl-C61-butyric acid cholesteryl ester). However, it is provided as an example only and the disclosure is not limited to the materials.

Here, in an inverted structure, $TiO_2$-based or $Al_2O_3$-based porous materials may be generally used for the electron transport layer, but it is provided as an example only.

The electron transport layer according to an embodiment may be configured as the n-type oxide 121.

Depending on embodiments, the n-type oxide 121 may include, desirably, zinc oxide (ZnO), more desirably, dopant-doped zinc oxide.

The LED 100 may have charge injection properties, depending on a work function of a metal. In the case of the conventional LED 100 including a charge injection layer configured as a single p-type oxide 122 or n-type oxide 121, charge injection may not be smoothly performed due to the energy barrier by a work function of upper/lower electrodes, for example, the anode 110 or the cathode 140.

However, when the CGJ layer 120 is formed on the LED 100 according to an embodiment, charge is generated on the interface between the p-type oxide 122 and the n-type oxide 121. Therefore, although metals having different work functions are used for electrodes, there is no effect on the energy barrier by the work functions.

That is, since the CGJ layer 120 according to an embodiment allows charge to be generated on the interface between the p-type oxide 122 and the n-type oxide 121, charge generation and injection may be stabilized.

Hereinafter, a current flow of a CGJ layer according to an embodiment is described.

Figure 2A:
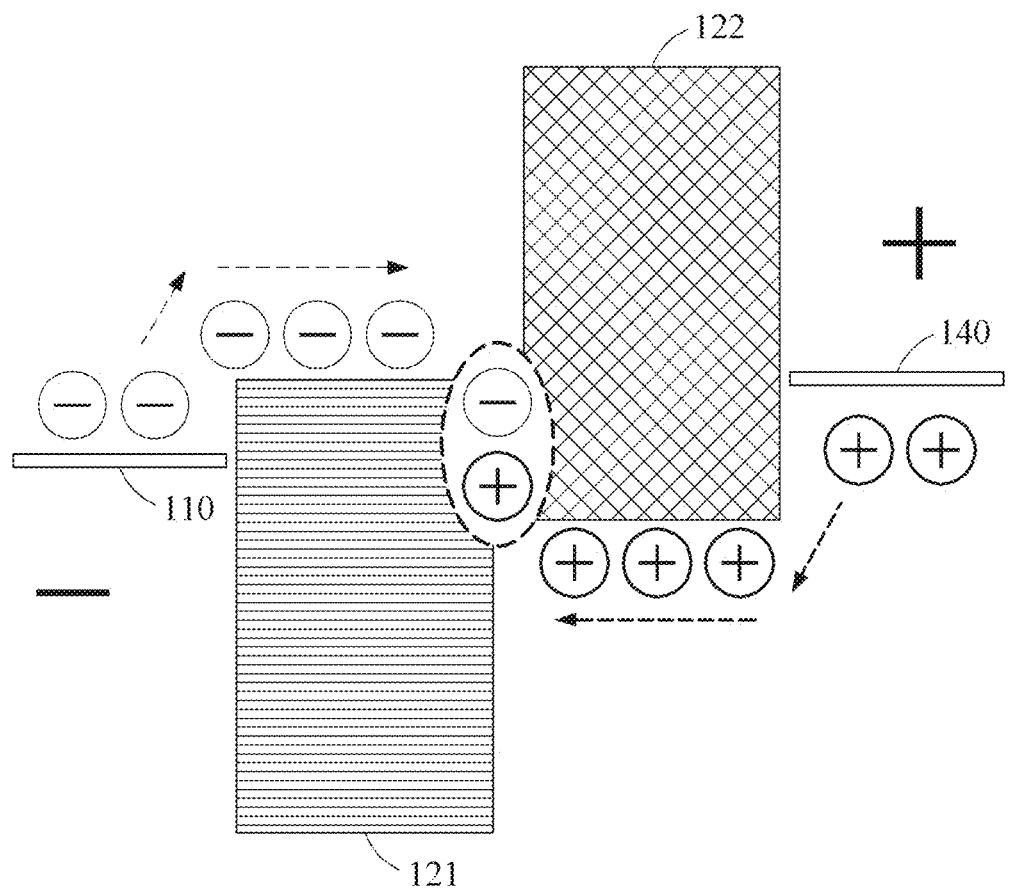
FIG. 2A illustrates a current flow of a charge generation junction (CGJ) layer in forward bias of an LED according to an embodiment.
Figure 2B:
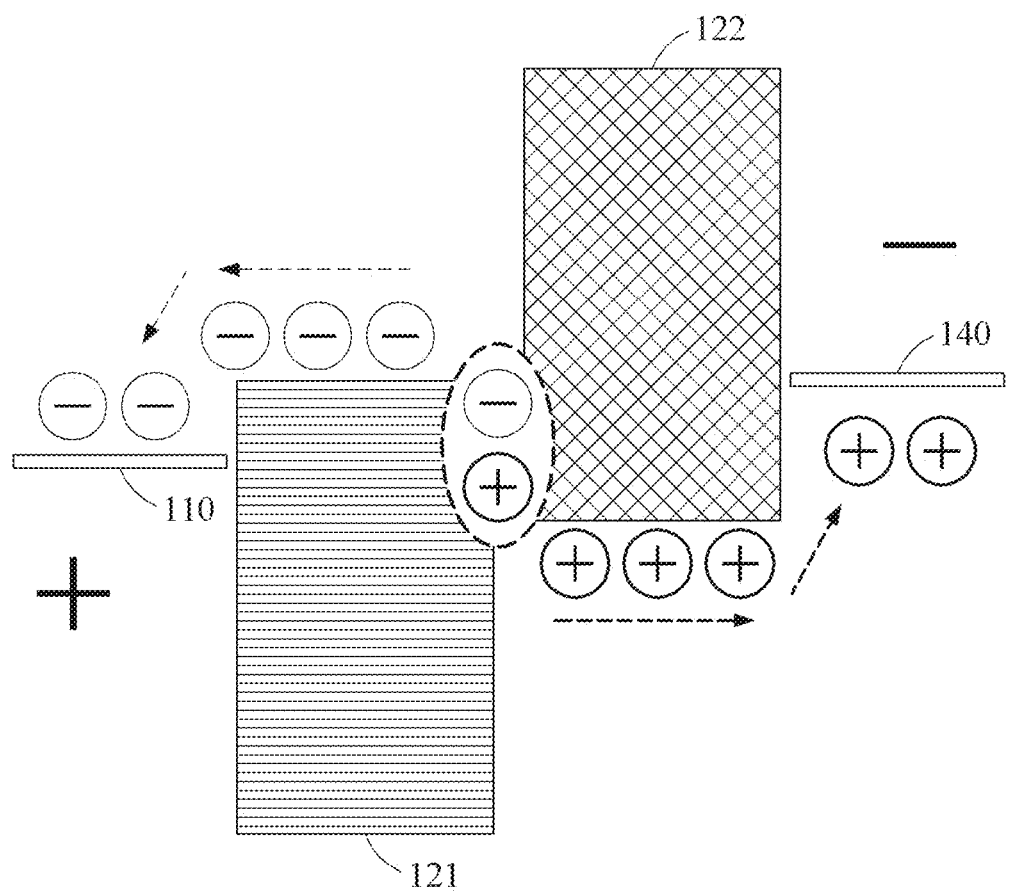
FIG. 2B illustrates a current flow of a CGJ layer in reverse bias of an LED according to an embodiment.

FIG. 2A illustrates a current flow of a CGJ layer in forward bias of an LED according to an embodiment, and FIG. 2B illustrates a current flow of a CGJ layer in reverse bias of an LED according to an embodiment.

FIGS. 2A and 2B illustrate a current flow in forward bias and reverse bias when the p-type oxide 122 of the CGJ layer according to an embodiment is lithium (Li)-doped zinc oxide (LZO) and the n-type oxide 121 of the CGJ layer is $Cu_2SnS_3$—$Ga_2O_3$.

Specific examples of manufacturing the CGJ layer will be described with the following property evaluation.

Referring to FIG. 2A, in the forward bias, holes and electrons are respectively injected from the anode 110 and the cathode 140 and transported through a valence band maximum (VBM) of $Cu_2SnS_3$—$Ga_2O_3$ and a conduction band minimum (CBM) of LZO. The holes and the electrons are recombined on the interface between LZO and $Cu_2SnS_3$—$Ga_2O_3$.

Referring to FIG. 2B, on the contrary, in the reverse bias, electrons move from the VBM of $Cu_2SnS_3$—$Ga_2O_3$ to the CBM of LZO and holes are formed at the VBM of $Cu_2SnS_3$—$Ga_2O_3$.

Holes and electrons are generated on the interface between LZO and $Cu_2SnS_3$—$Ga_2O_3$ constituting the CGJ layer, and the generated holes and electrons move to electrodes, for example, the anode 110 and the cathode 140, through the reverse electric field.

Here, forward current is caused by charge injected from the electrodes, for example, the anode 110 and the cathode 140, and reverse current is caused by charge generated in the CGJ layer.

Figure 3:
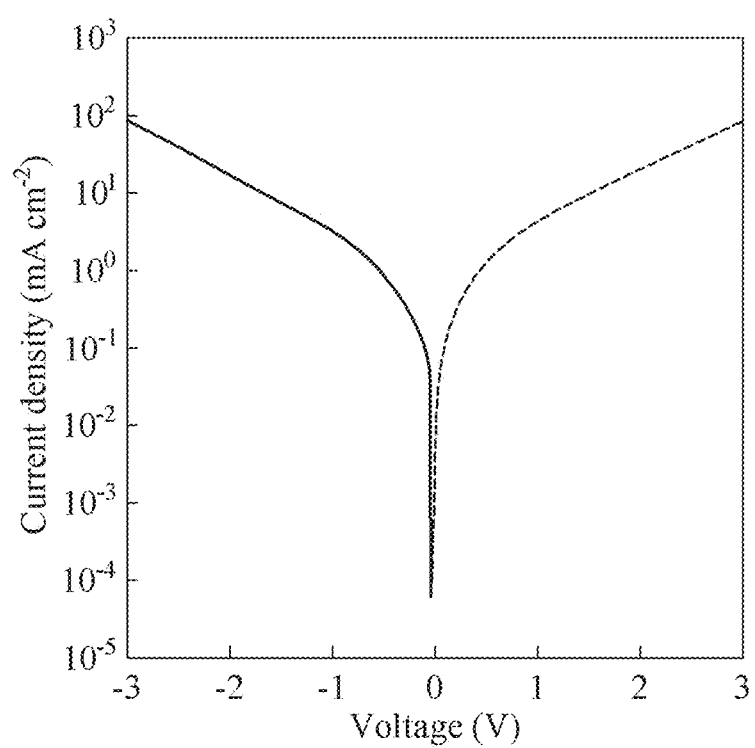
FIG. 3 is a graph showing current-voltage properties of a CGJ layer in forward bias and reverse bias of an LED according to an embodiment.

FIG. 3 is a graph showing current-voltage properties of a CGJ layer in forward bias and reverse bias of an LED according to an embodiment.

Referring to FIG. 3, since the reverse current density indicated is almost identical to the forward current density, it can be seen that the effective charge generation is possible in a CGJ layer according to an embodiment.

The LED according to an embodiment includes the CGJ layer having the excellent charge generation and transport capability and thus, may have the current efficiency (CE) of 1 cd/A to 100 cd/A and the external quantum efficiency (EQE) of 5% to 25%.

The LED according to an embodiment may be a multi-stacked LED that includes at least two light emitting layers.

In detail, the multi-stacked LED according to an embodiment may include an anode, a hole transport layer, at least two light emitting layers, and a cathode.

The CGJ layer formed in a layer-by-layer structure in which an n-type oxide and a p-type oxide are sequentially stacked may be included between the at least two light emitting layers.

Here, the hole transport layer and the light emitting layer may be referred to as an EL unit. The multi-stacked LED according to an embodiment may include at least two EL units.

Therefore, the CGJ layer formed in the multi-stacked LED according to an embodiment may be formed between the at least two EL units.

Depending on embodiments, the CGJ layer formed in the multi-stacked LED according to an embodiment may be selectively formed between the anode and the EL unit or between the cathode and the EL unit.

In the CGJ layer formed in the multi-stacked LED according to an embodiment, the n-type oxide and the p-type oxide may have the band gap energy of 3.0 eV or more.

In the CGJ layer formed in the multi-stacked LED according to an embodiment, the n-type oxide may include zinc oxide and, depending on embodiments, may be zinc oxide doped with a dopant.

The dopant may include at least one of cesium (Cs), lithium (Li), aluminum (Al), magnesium (Mg), indium (In), and gallium (Ga).

In the CGJ layer formed in the multi-stacked LED according to an embodiment, the p-type oxide may be a material represented by the following Formula.

$Cu_2Sn_{2-X}S_3$—$(Ga_X)_2O_3$      [Formula]

Here, 0.2<x<1.5.

For example, the n-type oxide may be LZO and the p-type oxide may be $Cu_2SnS_3$—$Ga_2O_3$.

The light emitting layer included in the multi-stacked LED according to an embodiment may include one of a quantum dot, an oxide layer, a nitride layer, a semiconductor layer, an organic compound layer, an inorganic compound layer, a phosphor layer, and a dye layer.

Detailed description related to the anode, the CGJ layer, the EL unit, and the cathode included in the multi-stacked LED according to an embodiment is made above with reference to FIGS. 1A to 3 and thus, further description is omitted.

Hereinafter, a structure of a multi-stacked LED according to an embodiment is further described with reference to FIGS. 4A and 4B.

Figure 4A:
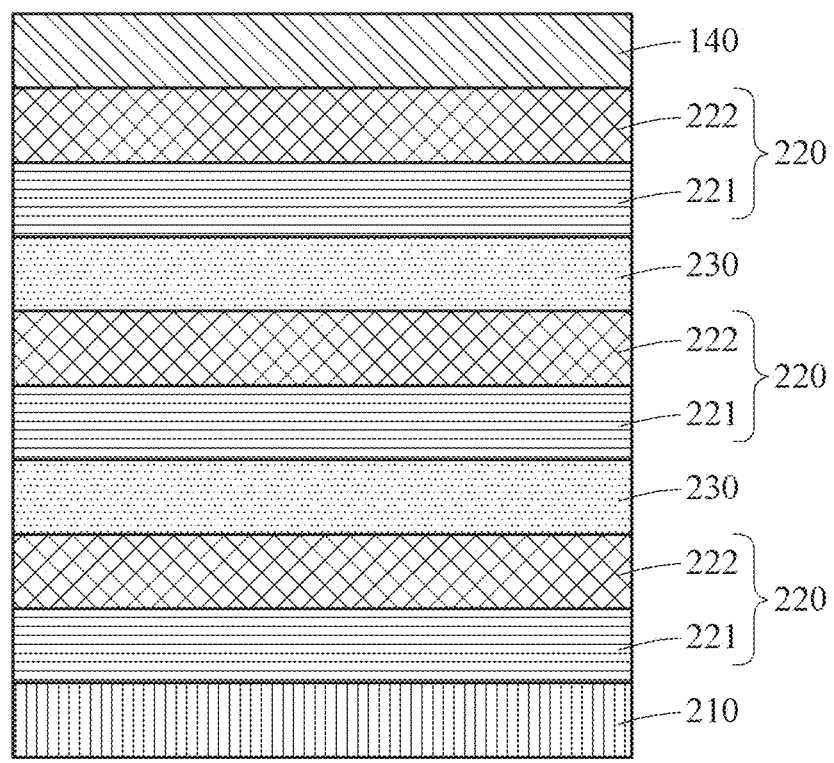
FIGS. 4A and 4B are cross-sectional views illustrating a detailed structure of a multi-stacked LED according to an embodiment.
Figure 4B:
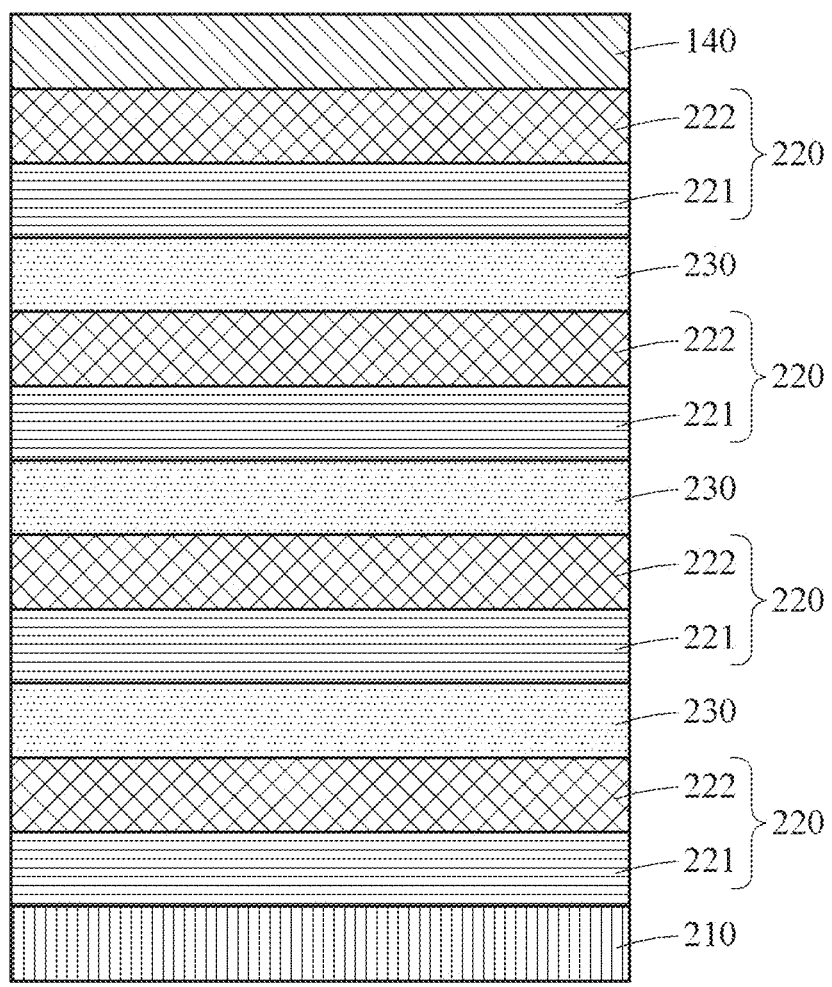

FIGS. 4A and 4B are cross-sectional views illustrating a detailed structure of a multi-stacked LED according to an embodiment.

Referring to FIG. 4A, a multi-stacked LED 200 according to an embodiment may include two EL units 230, and may be formed in a stacked structure in sequential order of anode 210-CGJ layer 220-EL unit 230-CGJ layer 220-EL unit 230-CGJ layer 220-cathode 240.

The CGJ layer 220 formed between two EL units 230 includes an n-type oxide 221 formed on the EL unit 230 provided on the bottom surface of the CGJ layer 220 and a p-type oxide 222 formed on the EL unit 230 provided on the top surface of the CGJ layer 220 to enable switching between holes and electrons for charge transport.

Referring to FIG. 4B, the multi-stacked LED 200 according to an embodiment may include three EL units 230, may be in a stacked structure in sequential order of anode 210-CGJ layer 220-EL unit 230-CGJ layer 220-EL unit 230-CGJ layer 220-EL unit 230-CGJ layer 220-cathode 240.

Likewise, even in the case of the multi-stacked LED 200 that includes EL units 230, the CGJ layer 220 includes the n-type oxide 221 formed on the EL unit 230 provided on the bottom surface of the CGJ layer 220 and the p-type oxide 222 formed on the EL unit 230 provided on the top surface of the CGJ layer 220 to enable switching between hole and electron transportation.

The multi-stacked LED 200 according to an embodiment may be formed in a tandem structure that includes at least two light emitting layers and thus, may achieve high performance at low cost.

In the multi-stacked LED 200 according to an embodiment, charge may be generated on the interface between the n-type oxide 221 and the p-type oxide 222. Therefore, although metals having different work functions are used for electrodes, there is no effect on the energy barrier by the work functions.

That is, in the multi-stacked LED 200 according to an embodiment, charge generation occurs on the interface between the n-type oxide 221 and p-type oxide 222 due to the CGJ layer 220 formed between the light emitting layers. Therefore, charge generation and injection may be stabilized.

The multi-stacked LED 200 according to an embodiment may include a plurality of CGJ layers 220 having excellent charge generation and transport capability and thus, may have the current efficiency (CE) of 3 cd/A to 300 cd/A and the external quantum efficiency (EQE) of 15% to 75%.

Hereinafter, a process of manufacturing an LED according to an embodiment is described.

FIG. 5 is a flowchart illustrating a process of manufacturing an LED according to an embodiment.

Referring to FIG. 5, a method of manufacturing an LED according to an embodiment includes operation S110 of forming an anode on a substrate, operation S120 of forming a hole transport layer on the anode, operation S130 of forming a light emitting layer on the hole transport layer, operation S140 of forming a cathode on the light emitting layer, and operation S150 of forming a CGJ layer on at least one surface of the light emitting layer.

Depending on embodiments, by performing operation S150 after operation S110, the LED may be manufactured such that the CGJ layer may be formed between the anode and the light emitting layer. Alternatively, by performing operation S150 after operation S130, the LED may be manufactured such that the CGJ layer may be formed between the light emitting layer and the cathode.

Alternatively, by performing operation S150 after operation S110 or operation S130, the LED may be manufactured such that the CGJ layer may be formed between the light emitting layer and the anode and between the light emitting layer and the cathode.

The method of manufacturing an LED according to an embodiment differs from the LED described above with reference to FIGS. 1A to 5 only in terms of categories and thus, repeated description is omitted.

In operation S110, a material for the anode may be formed on the substrate using, for example, a thermal evaporation, an e-beam evaporation, a radio frequency (RF) sputtering, a magnetron sputtering, a vacuum deposition, or a chemical vapor deposition. However, it is provided as an example only.

Depending on embodiments, in operation S110, the anode may be formed on the substrate using conventional technology, for example, a deposition scheme such as a chemical vapor deposition (CVD) or a scheme of printing paste metal ink in which metal flakes and particles are mixed with a binder. Here, any methods capable of forming an electrode may apply.

Examples of a material for the anode used in operation S110 are described above with reference to FIGS. 1A to 1D and thus, further description is omitted.

In operation S120, the hole transport layer may be formed by applying a material capable of forming the hole transport layer on the anode through a spray coating, a spin coating, an ultra-spray coating, an electrospun coating, a slot dye coating, a gravure coating, a bar coating, a roll coating, a dip coating, a shear coating, a screen printing, an inkjet printing, or a nozzle printing. However, it is provided as an example only.

Examples of the material for the hole transport layer used in operation S120 are described above with reference to FIGS. 1A to 1D and thus, further description is omitted.

In operation 130, the light emitting layer may be formed by applying a material capable of forming the light emitting layer through a vacuum deposition, a chemical vapor deposition, a physical vapor deposition, an atomic layer deposition, a metal organic chemical vapor deposition, a plasma-enhanced chemical vapor deposition, a molecular beam epitaxy, a hydride vapor phase epitaxy, a sputtering, a spin coating, a dip coating, and a zone casting.

Examples of the material for the light emitting layer used in operation S130 may include a quantum dot, organic compound, oxide, nitride, a semiconductor material, inorganic compound, a phosphor material, and dye, which are described above with reference to FIGS. 1A to 1D and thus, further description is omitted.

In operation S140, if the cathode is a transparent metal oxide electrode, the cathode may be formed by applying a sol-gel, a spray pyrolysis, a sputtering, an atomic layer deposition (ALD) or an e-beam evaporation.

The cathode may be formed using a deposition scheme, such as a chemical vapor deposition (CVD) or a scheme of printing paste metal ink in which metal flakes or particles are mixed with a binder. Any methods capable forming an electrode may apply.

In operation S150, the CGJ layer may be formed on at least one surface of the light emitting layer using a solution process.

The CGJ layer may be formed on at least one surface of the light emitting layer in a layer-by-layer structure in which the n-type oxide and the p-type oxide are sequentially stacked.

The n-type oxide may include zinc oxide and, depending on embodiments, may be zinc oxide doped with a dopant.

The p-type oxide may be a material represented by the following Formula.

$$Cu_2Sn_{2-x}S_3-(Ga_x)_2O_3 \qquad [Formula]$$

Here, $0.2<x<1.5$.

Depending on embodiments, the n-type oxide may be LZO and the p-type oxide may be $Cu_2SnS_3-Ga_2O_3$.

A process of forming the CGJ layer is further described with reference to FIG. 6.

Figure 6:
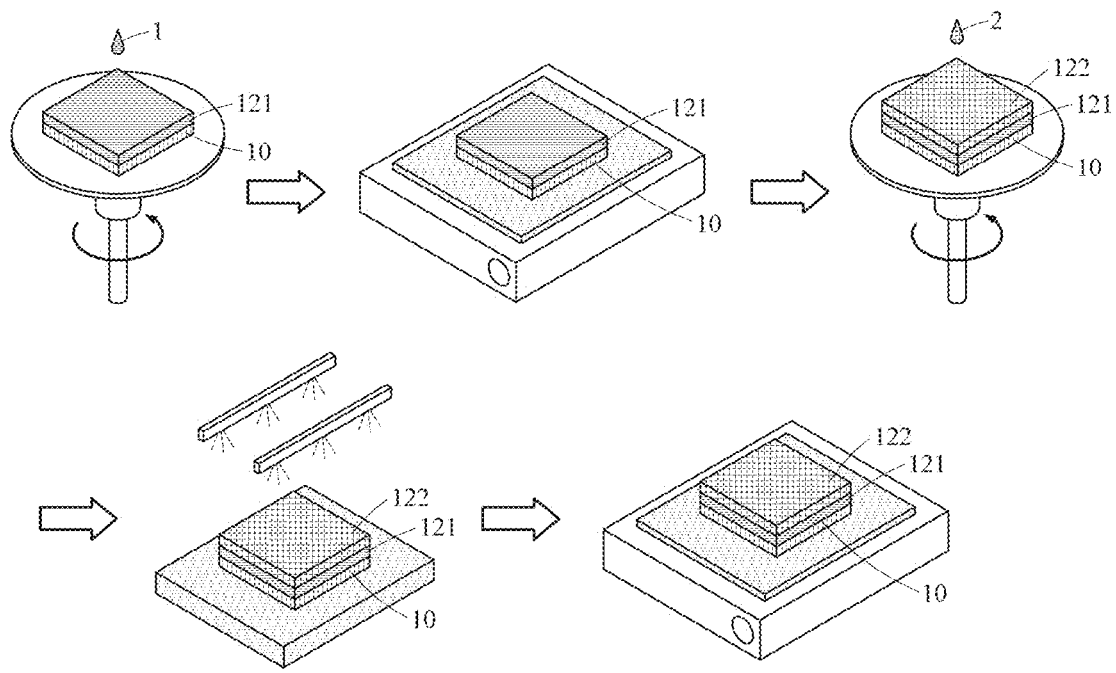
FIG. 6 illustrates a process of manufacturing a CGJ layer according to an embodiment.

FIG. 6 illustrates a process of manufacturing a CGJ layer according to an embodiment.

Referring to FIG. 6, a method of manufacturing a CGJ layer forms an n-type oxide 121 by applying an n-type oxide solution 1 over a substrate 10.

The n-type oxide solution 1 includes the n-type oxide 121 and may include zinc oxide or zinc oxide doped with a dopant.

A solvent available for the n-type oxide solution 1 may be prepared by mixing at least one of 5 to 50% by volume of 2-methoxyethanol, acetonitrile, DI water, alcohol, cyclohexane, toluene, and an organic solvent with ethylene glycol.

The n-type oxide 121 may be formed using one solution process selected from a spin-coating, a slit dye coating, an ink-jet printing, a spray coating, and a dip coating.

Desirably, the n-type oxide 121 may be formed using a spin coating with a centrifugal force applied to a solution by dropping a predetermined amount of solution over the substrate 10 and then rotating the substrate 10 at a high speed.

Subsequently, a p-type oxide 122 is formed by applying a p-type oxide solution 2 over the top surface of the n-type oxide 121.

The p-type oxide solution 2 includes the p-type oxide 122 and may be a material represented by the above Formula.

A solvent available for the p-type oxide solution 2 may be prepared by mixing at least one of 5 to 50% by volume of 2-methoxyethanol, acetonitrile, DI water, alcohol, cyclohexane, toluene, and an organic solvent with ethylene glycol.

Similar to the n-type oxide 121, the p-type oxide 122 may be formed using one solution process selected from a spin-coating, a slit dye coating, an ink-jet printing, a spray coating, and a dip coating.

Subsequently, heat treatment or ultraviolet (UV)/ozone treatment may be performed on the substrate 10 on which the n-type oxide 121 and the p-type oxide 122 are formed.

The heat treatment may be performed for 10 minutes to 60 minutes at 150° C. to 250° C.

The UV/ozone treatment may be performed for 30 seconds to 5 minutes.

Although FIG. 6 illustrates that the CGJ layer according to an embodiment is formed on the substrate 10, the CGJ layer may be formed on the anode or the light emitting layer to be in contact with at least one surface of the light emitting layer through the aforementioned process.

The CGJ layer may be formed through the solution process, which may enable a large-scale process at a low temperature, may save a process time, and may relieve constraints on semiconductor properties of upper and lower electrodes, for example, the anode and the cathode.

Referring again to FIG. 5, the method of manufacturing an LED according to an embodiment may manufacture a multi-stacked LED by repeatedly performing operations S130 and S150.

In detail, the method of manufacturing an LED according to an embodiment may manufacture the multi-stacked LED including at least two light emitting layers in which the CGJ layer is formed between the at least two light emitting layers by repeatedly performing operations S130 and S150.

The method of manufacturing an LED according to an embodiment may repeatedly perform operations S120, S130, and S150 to form at least two EL units including the hole transport layer and the light emitting layer and to form the CGJ layer between the at least two EL units.

Hereinafter, properties of an LED according to embodiments are described with reference to FIGS. 7 to 17B.

Embodiment 1

An ITO glass substrate with sheet resistance of 9 Ω/sq was cleaned by sequentially ultrasonic treating each of acetone, methanol, and isopropanol for 15 minutes.

Next, for a spin coating process, the ITO substrate was moved to a glove box filled with $N_2$.

A hole injection layer was formed on the ITO substrate by spin-coating $Cu_2SnS_3-Ga_2O_3$ at 4000 rpm and then baking the same for 60 minutes at 200 É.

A hole transport layer was formed on the hole injection layer by spin-coating poly(9-vinylcarbazole) (PVK) at 4000 rpm and then baking the same for 10 minutes at 160 É.

A light emitting layer was formed on the hole transport layer by spin-coating a solution including a quantum dot at 2000 rpm and then baking the same for 10 minutes at 190 É.

A blue light emitting layer is formed with a solution in which CdS/ZnS is dissolved in toluene at the concentration of 10 mg/mL, a green light emitting layer is formed in a solution in which CdZnSeS/ZnS is dissolved in toluene at the concentration of 10 mg/mL, and a red light emitting layer is formed in a solution in which a CdZnSeS/ZnS is dissolved in toluene at the concentration of 10 mg/mL.

An electron transport layer was formed on the light emitting layer by spin-coating LZO at 2000 rpm and then baking the same for 30 minutes at 200 É.

Accordingly, an LED, that is, a quantum dot LED (QLED) was manufactured by depositing 100 nm of Al through thermal evaporation under high vacuum and by forming a cathode on the electron transport layer.

Embodiment 2

An LED was manufactured in the same manner as in Embodiment 1, except for forming a CGJ layer on a light emitting layer by spin-coating LZO as an n-type oxide at 2000 rpm and baking the same for 30 minutes at 200 É and then by spin-coating $Cu_2SnS_3-Ga_2O_3$ as a p-type oxide at 4000 rpm and baking the same for 60 minutes at 200 É.

Embodiment 3

An LED was manufactured in the same manner as in Embodiment 1, except for forming a CGJ layer on an anode by spin-coating LZO as an n-type oxide at 2000 rpm and baking the same for 30 minutes at 200 É and then by spin-coating $Cu_2SnS_3-Ga_2O_3$ as a p-type oxide at 4000 rpm and baking the same for 60 minutes at 200 É.

Embodiment 4

An LED was manufactured in the same manner as in Embodiment 1, except for forming a CGJ layer on an anode and a light emitting layer by spin-coating LZO as an n-type oxide at 2000 rpm and baking the same for 30 minutes at 200 É and then by spin-coating $Cu_2SnS_3$—$Ga_2O_3$ as a p-type oxide at 4000 rpm and baking the same for 60 minutes at 200 É.

Embodiment 5

A multi-stacked LED, for example, a 2-stacked LED was manufactured in the same manner as in Embodiment 1, except for forming a CGJ layer after forming a hole transport layer and a light emitting layer between the CGJ layer and a cathode in Embodiment 4.

Embodiment 6

A multi-stacked LED, for example, a 3-stacked LED was manufactured in the same manner as in Embodiment 1, except for forming a CGJ layer after forming a hole transport layer and a light emitting layer between the CGJ layer and a cathode and also emitting white light by forming blue, green, and red light emitting layers on the light emitting layer in Embodiment 5.

Embodiment 7

An LED, for example, an organic LED (OLED) was manufactured in the same manner as in Embodiment 1, except for forming a CGJ layer on an anode by sequentially stacking LZO as an n-type oxide and $Cu_2SnS_3$—$Ga_2O_3$ as a p-type oxide, not a hole injection layer.

Embodiment 8

An LED (e.g., OLED) was manufactured in the same manner as in Embodiment 1, except for forming a CGJ layer on an anode by sequentially stacking $Cu_2SnS_3$—$Ga_2O_3$ as a p-type oxide and LZO as an n-type oxide, not a hole injection layer.

Comparative Example 1

An LED (e.g., OLED) was manufactured in the same manner as in Embodiment 1, except for using $Cu_2SnS_3$—$Ga_2O_3$ as a hole injection layer, TCTA/NPB as a hole transport layer, TCTA:TPBi:Ir (ppy)$_3$ as a light emitting layer, TPBi as an electron transport layer, and LiF/Al as a cathode.

Comparative Example 2

An LED (e.g., OLED) was manufactured in the same manner as in Embodiment 1, except for using LZO and MLZO (ZnO doped with Mg and Li) as a hole injection layer, PEIE:$Rb_2CO_3$ as a hole transport layer, TCTA:TPBi:Ir (ppy)$_3$ as a light emitting layer, TCTA/NPB as an electron transport layer, and HAT-CN as an electron injection layer.

Property Evaluation

1. Properties of CGJ Layer

Figure 7:
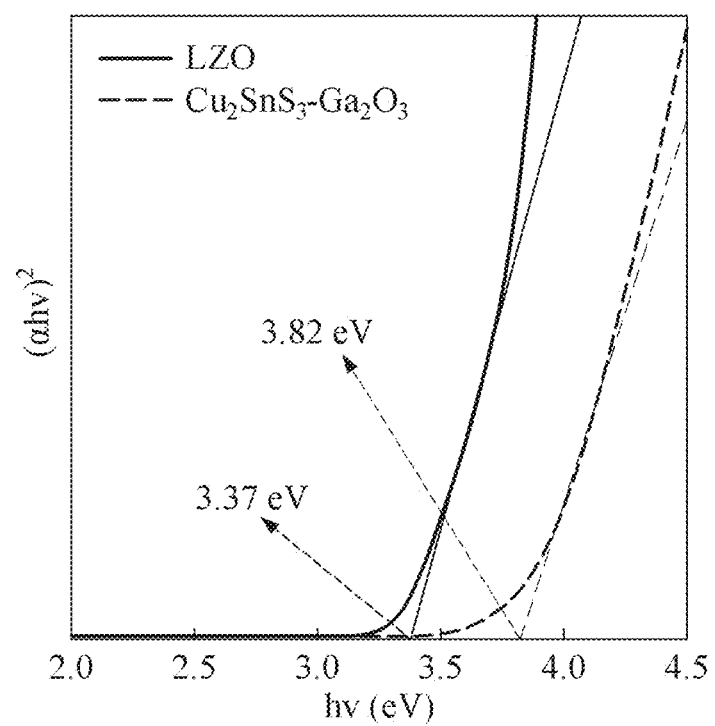
FIG. 7 is a graph showing optical band gap properties of an n-type oxide and a p-type oxide of an LED according to an embodiment.

FIG. 7 is a graph showing optical band gap properties of an n-type oxide and a p-type oxide of an LED according to an embodiment.

Referring to FIG. 7, it can be seen that LZO, i.e., the n-type oxide, and $Cu_2SnS_3$—$Ga_2O_3$, that is, the p-type oxide, which constitute the CGJ layer formed in the above Embodiment 1 to Embodiment 8, have the optical band gap of 3.37 eV and 3.82 eV, respectively.

Figure 8:
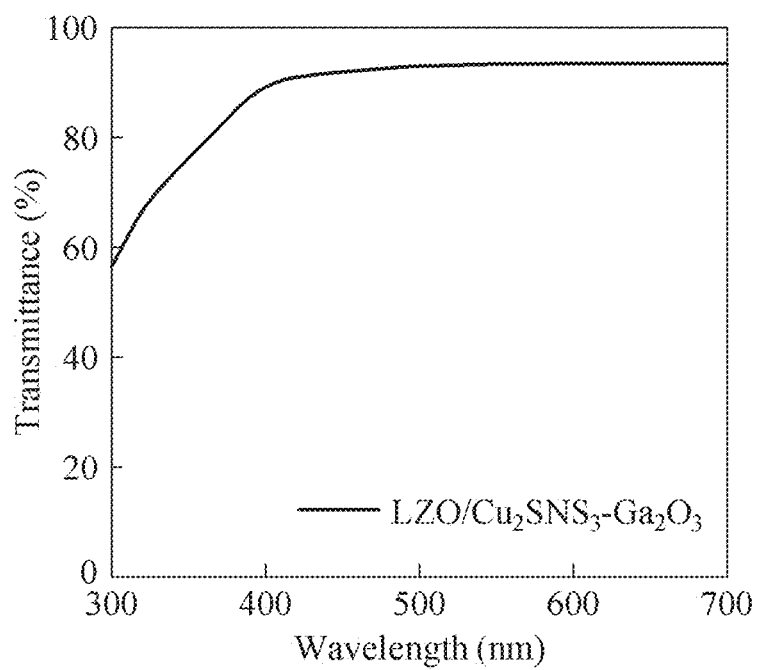
FIG. 8 is a graph showing transmittance of a CGJ layer according to an embodiment.

FIG. 8 is a graph showing transmittance of a CGJ layer according to an embodiment.

Referring to FIG. 8, it can be seen that the CGJ layer formed in the above Embodiment 1 to Embodiment 8 has the transmittance of about 93%, which is significantly high.

That is, since the transmittance of the CGJ including the n-type oxide and the p-type oxide according to an embodiment is very high, it is possible to further transmit light emitted from the LED and thereby allow more light to be emitted.

2. Electrical Properties of QLED

Hereinafter, electrical properties of the LED (QLED) according to the above Embodiment 1 to Embodiment 4 were evaluated.

Figure 9A:
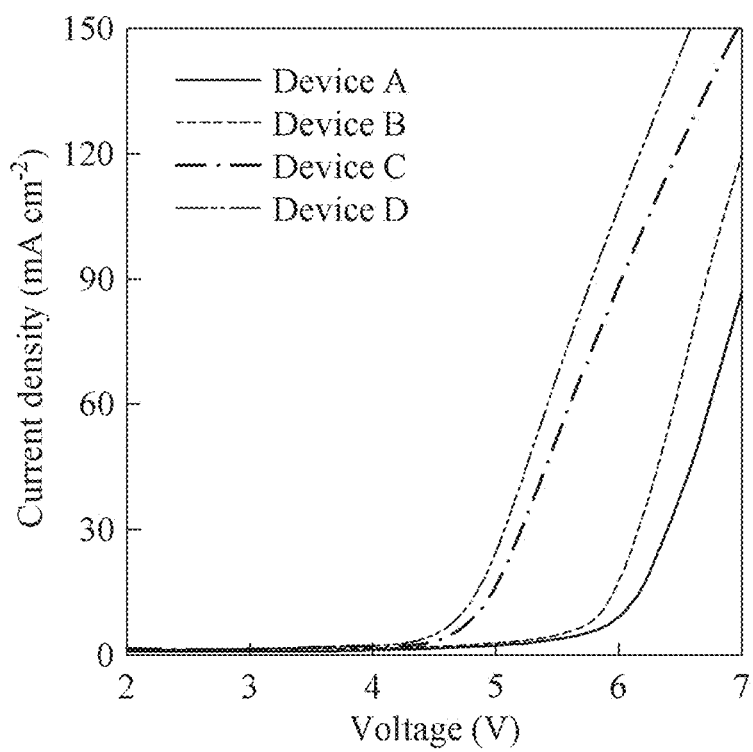
FIG. 9A is a graph showing a current-voltage curve of an LED according to an embodiment.

FIG. 9A is a graph showing a current-voltage curve of an LED according to an embodiment.

Referring to FIG. 9A, it can be seen that, based on the same voltage condition, Embodiment 4 (Device D) exhibits the largest current density and the current density decreases in order of Embodiment 3 (Device C), Embodiment 2 (Device B), and Embodiment 1 (Device A).

That is, since the largest current density is achieved in Embodiment 4 in which the CGJ layer is formed on each of both surfaces of the light emitting layer, it is desirable to form the CGJ layer on each of both surfaces of the light emitting layer, rather than on one surface of the light emitting layer, to manufacture a high efficiency LED.

Also, it can be seen that the difference in the current density between Embodiment 3 and Embodiment 4 and the difference in the current density between Embodiment 1 and Embodiment 2 are almost same under the same voltage.

Further, it can be seen that the difference in the current density between Embodiment 2 and Embodiment 3 is greater than the difference in the current density between Embodiment 3 and Embodiment 4 or the difference in the current density between Embodiment 1 and Embodiment 2 under the same voltage.

Embodiment 2 relates to the LED in which the CGJ layer is formed on the light emitting layer and Embodiment 3 relates to the LED in which the CGJ layer is formed on the anode. It can be seen that the current density of the LED in which the CGJ layer is formed on the anode is relatively greater and thus, higher efficiency is achieved.

In the case of the quantum dot LED (QLED) using the ZnO electron transport layer and the PVK hole transport layer, the electron mobility ($\sim 10^4$ cm$^2$ v$^4$ s$^{-1}$) of ZnO is significantly great compared to the hole mobility ($\sim 10^{-6}$ cm$^2$ v$^{-1}$ s$^{-1}$) of PVK.

The great difference between the electron mobility and the hole mobility causes charge imbalance in the quantum dot light emitting layer.

In Embodiment 3, it can be seen that the current density is high due to the improvement in the hole mobility by the CGJ layer and the balanced charge injection.

That is, according to data of Embodiment 2 and Embodiment 3, the efficiency of the LED may vary based on a location at which the CGJ layer is formed.

Also, it can be seen that turn-on voltages and driving voltages of Embodiment 2 to Embodiment 4 are higher than those of Embodiment 1.

Through this, it is possible to verify efficient charge injection properties of the CGJ layer formed in Embodiment 2 to Embodiment 4.

Accordingly, to improve the efficiency of the LED, it may be desirable to form the CGJ layer on the anode. Also, to maximize the efficiency of the LED, the CGJ layer may be formed on each of both surfaces of the light emitting layer.

Figure 9B:
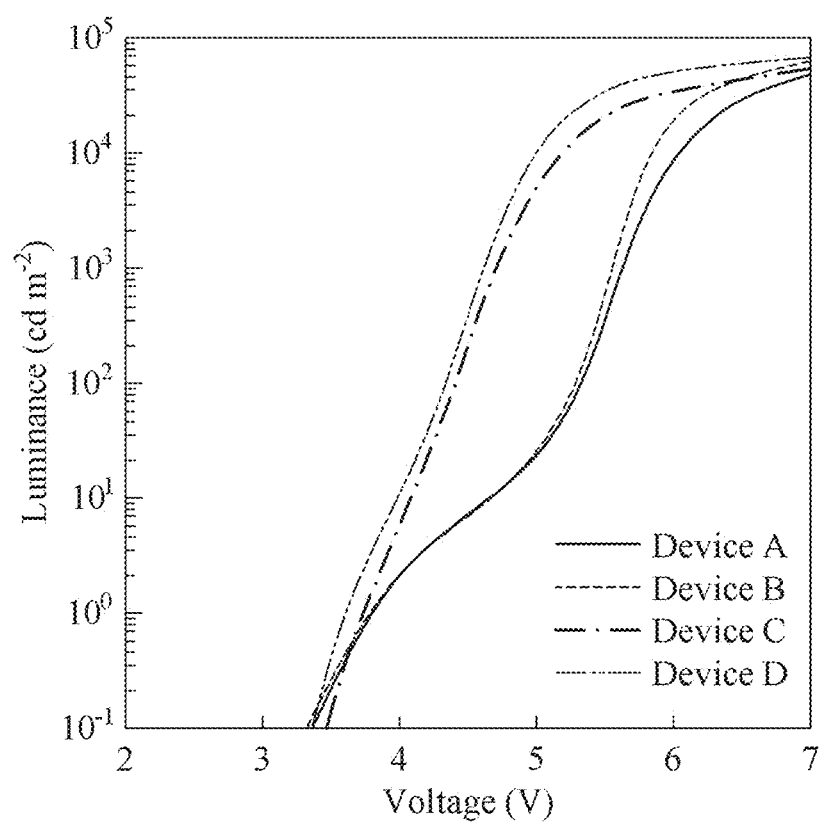
FIG. 9B is a graph showing a luminance-voltage curve of an LED according to an embodiment.

FIG. 9B is a graph showing a luminance-voltage curve of an LED according to an embodiment.

Referring to FIG. 9B, it can be seen that luminance of Embodiment 3 (Device C) and Embodiment 4 (Device D) is greater than that of Embodiment 1 (Device A) and Embodiment 2 (Device B).

In detail, the luminance of Embodiment 4 has a slightly greater value than the luminance of Embodiment 3 and the luminance of Embodiment 2 has a value almost similar to the luminance of Embodiment 1. Here, if the voltage is about 6V or more, the luminance of Embodiment 2 has a value greater than the luminance of Embodiment 1.

That is, it can be known that the luminous efficiency of Embodiment 4 in which the CGJ layer is formed on each of both surfaces of the light emitting layer is more excellent that that of Embodiment 2 and Embodiment 3 in which the CGJ layer is formed on only one surface of the light emitting layer.

Here, a great difference between luminance values of Embodiment 2 and Embodiment 3 is caused by a different formation location of the CGJ layer.

Embodiment 3 exhibits the improved hole mobility by the CGJ layer and the balanced charge injection and accordingly, has the luminance greater than that of Embodiment 2.

As described above with reference to FIG. 9A, a current density value varies based on a formation location of the CGJ layer, which causes the luminance value to differ.

Figure 9C:
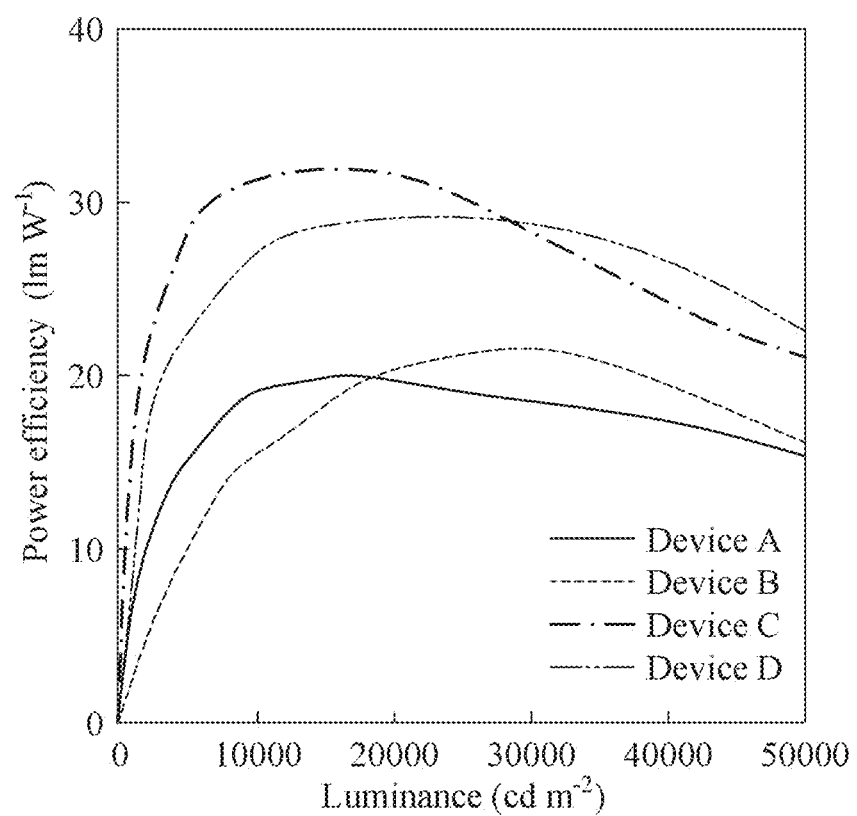
FIG. 9C is a graph showing a current efficiency-luminance curve according to an embodiment.

FIG. 9C is a graph showing a current efficiency-luminance curve according to an embodiment.

Referring to FIG. 9C, it can be seen that the current efficiency of Embodiment 2 to Embodiment 4 is greater than that of Embodiment 1.

That is, the CGJ layer formed in Embodiment 2 to Embodiment 4 may improve the current efficiency of the LED by efficiently transporting holes and electrons.

Also, it can be seen that Embodiment 4 does not show a great change in the current efficiency compared to Embodiment 2 and Embodiment 3 although the luminance increases. When the CGJ layer is formed on each of both surfaces of the light emitting layer rather than on one surface of the light emitting layer, the change in the current efficiency is small, which may lead to improving the durability of the LED.

Charge imbalance is likely to occur at high luminance. In Embodiment 2 and Embodiment 4 that relate to the LED in which the CGJ layer is formed on the cathode, charge injection balance is relatively excellent even at high luminance and a high current efficiency value may be acquired accordingly.

Figure 9D:
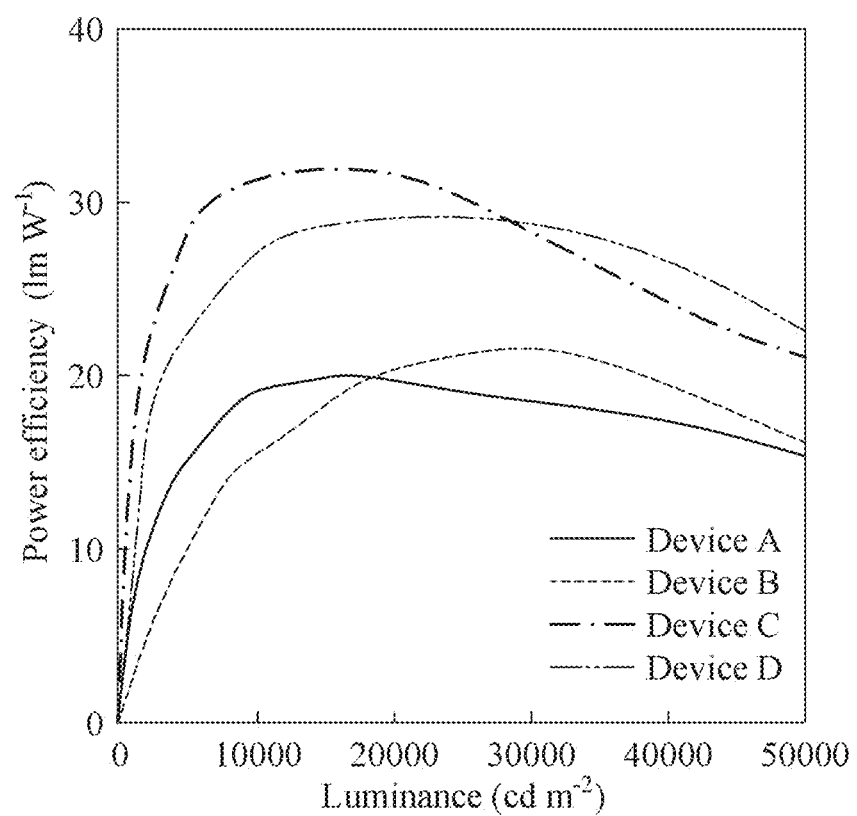
FIG. 9D is a graph showing a power efficiency-luminance curve according to an embodiment.

FIG. 9D is a graph showing a power efficiency-luminance curve according to an embodiment.

Referring to FIG. 9D, it can be seen that the power efficiency of Embodiment 2 to Embodiment 4 in which the CGJ layer is formed is greater than that of Embodiment 1.

That is, the CGJ layer formed in Embodiment 2 to Embodiment 4 may thereby improve the power efficiency of the LED by efficiently transporting holes and electrons.

Also, it can be seen that Embodiment 4 does not show a great decrease in the power efficiency compared to Embodiment 2 and Embodiment 3 although the luminance increases. When the CGJ layer is formed on each of both surfaces of the light emitting layer rather than on one surface of the light emitting layer, the change in the power efficiency is small, which may lead to improving the durability of the LED.

Charge imbalance is likely to occur at high luminance. In Embodiment 2 and Embodiment 4 that relate to the LED in which the CGJ layer is formed on the cathode, charge injection balance is relatively excellent even at high luminance and a high power efficiency value may be acquired accordingly.

3. Electrical Properties of Multi-Stacked QLED

Hereinafter, electrical properties of a multi-stacked LED were evaluated by comparing electrical properties between the LED according to Embodiment 4 and the multi-stacked LED according to Embodiment 5 and Embodiment 6.

Figure 10A:
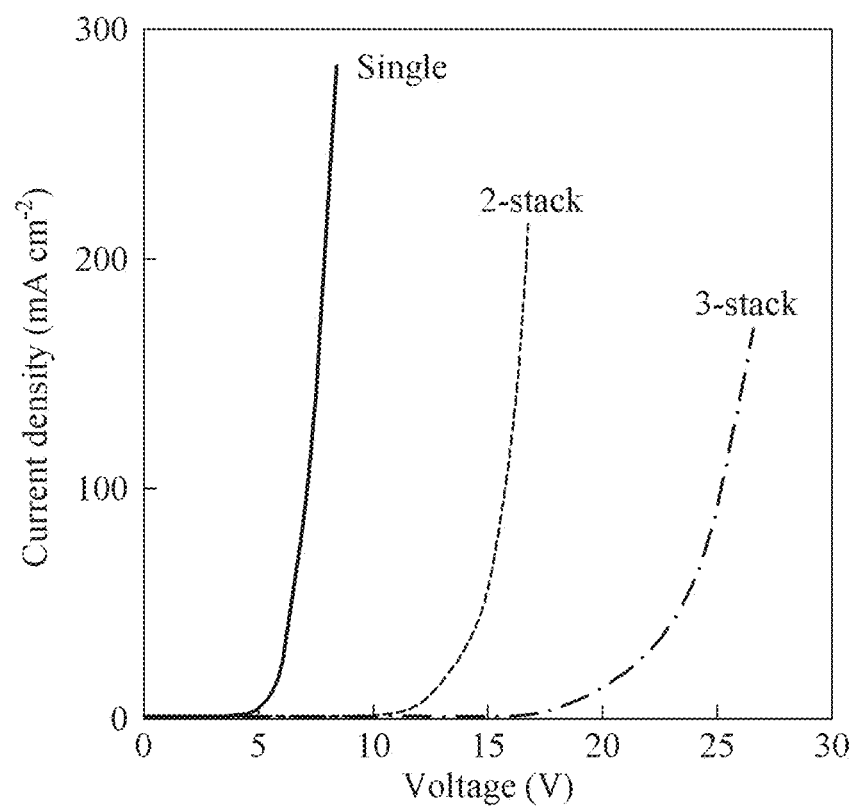
FIG. 10A is a graph showing a current-voltage curve of a blue LED and a multi-stacked blue LED according to an embodiment.
Figure 10B:
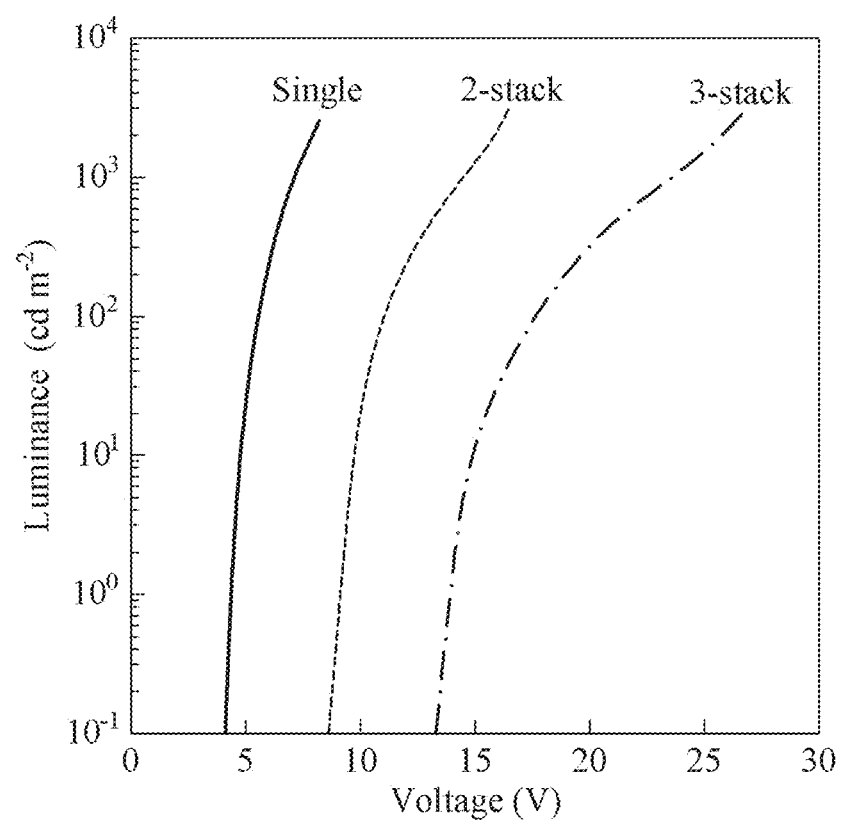
FIG. 10B is a graph showing a luminance-voltage curve of a blue LED and a multi-stacked blue LED according to an embodiment.
Figure 10C:
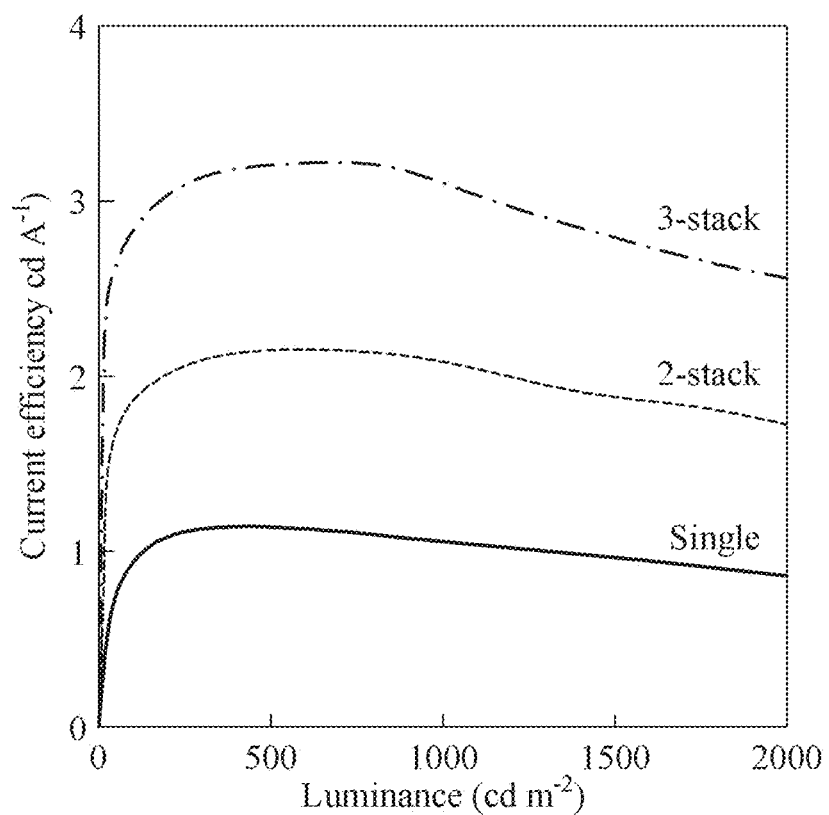
FIG. 10C is a graph showing a current efficiency-luminance curve of a blue LED and a multi-stacked blue LED according to an embodiment.

FIG. 10A is a graph showing a current-voltage curve of a blue LED and a multi-stacked blue LED according to an embodiment, FIG. 10B is a graph showing a luminance-voltage curve of a blue LED and a multi-stacked blue LED according to an embodiment, FIG. 10C is a graph showing a current efficiency-luminance curve of a blue LED and a multi-stacked blue LED according to an embodiment, and FIG. 10D is a graph showing an external quantum efficiency (EQE)-luminance curve of a blue LED and a multi-stacked blue LED according to an embodiment.

Referring to FIGS. 10A to 10D, it can be seen that Embodiment 5 (2-stack) and Embodiment 6 (3-stack) have the turn-on voltage of 9.06 V and 13.71 V, respectively.

Also, it can be seen that Embodiment 5 of blue and Embodiment 6 have the maximum current efficiency (CE) of 2.17 cd/A and 3.23 cd/A, respectively, and have the EQE of 9.89% and 14.70%, respectively.

The maximum current efficiency and the maximum EQE values of Embodiment 5 and Embodiment 6 are almost twice or three times greater than Embodiment 4 (Single) having the turn-on voltage of 4.37 V, the maximum current efficiency of 1.13 cd/A, and the maximum EQE of 5.12%.

Also, it can be seen that current density and luminance values of Embodiment 5 and Embodiment 6 are greater than those of Embodiment 4.

Accordingly, it can be known that the charge transport efficiency of Embodiment 5 and Embodiment 6 is which a more number of CGJ layers are formed is more excellent than that of Embodiment 4.

Comparing data between Embodiment 5 and Embodiment 6, current density, luminance, current efficiency, and EQE values of Embodiment 6 (3-stack) are greater than those of Embodiment 5 (2-stack).

Through this, it can be known that the charge transport efficiency of Embodiment 6 in which a more number of CGJ layers are formed is greater than that of Embodiment 5.

Figure 11A:
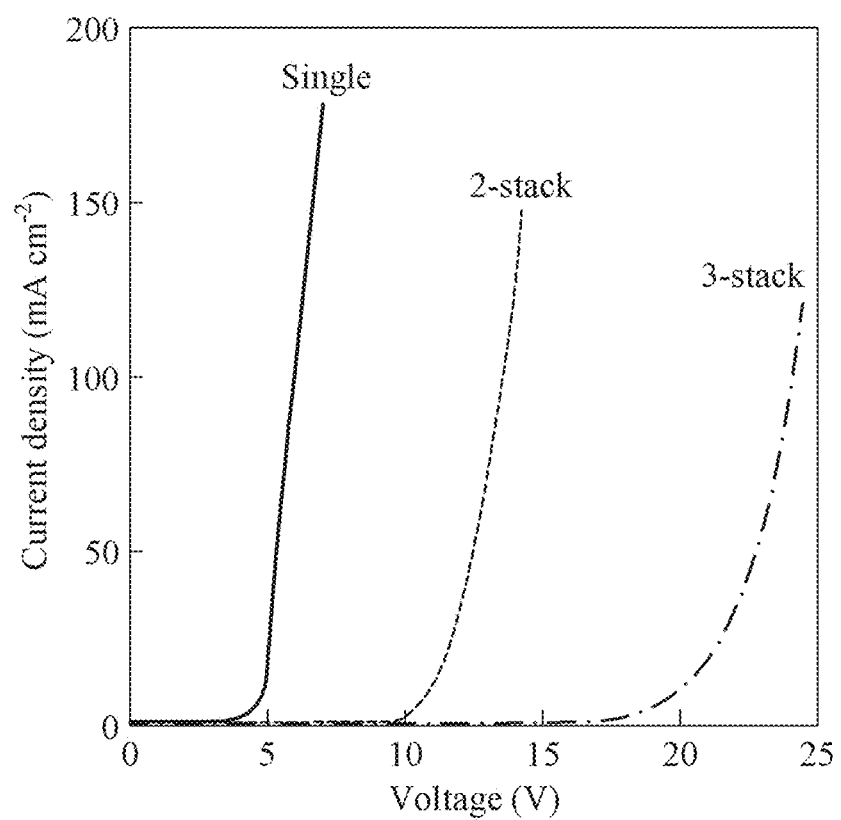
FIG. 11A is a graph showing a current-voltage curve of a green LED and a multi-stacked green LED according to an embodiment.
Figure 11B:
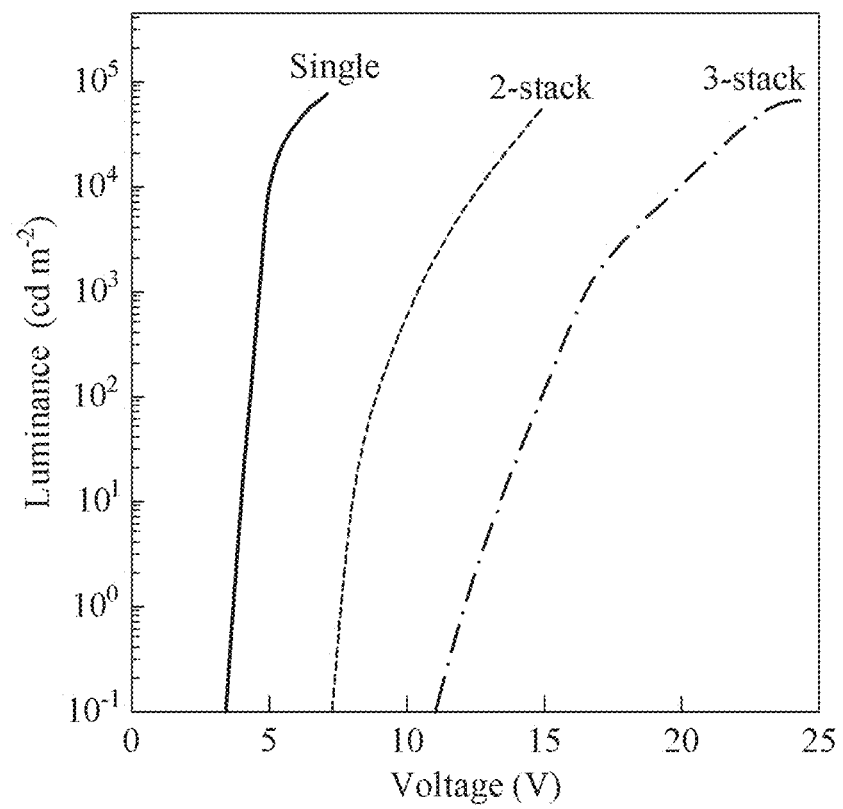
FIG. 11B is a graph showing a luminance-voltage curve of a green LED and a multi-stacked green LED according to an embodiment.
Figure 11C:
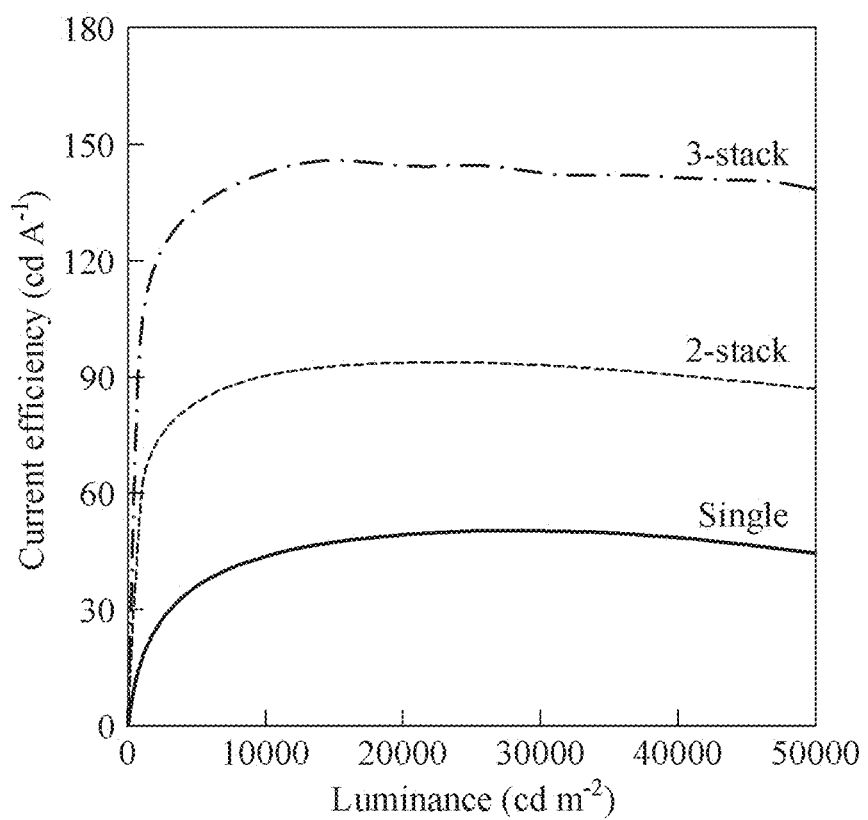
FIG. 11C is a graph showing a current efficiency-luminance curve of a green LED and a multi-stacked green LED according to an embodiment.
Figure 11D:
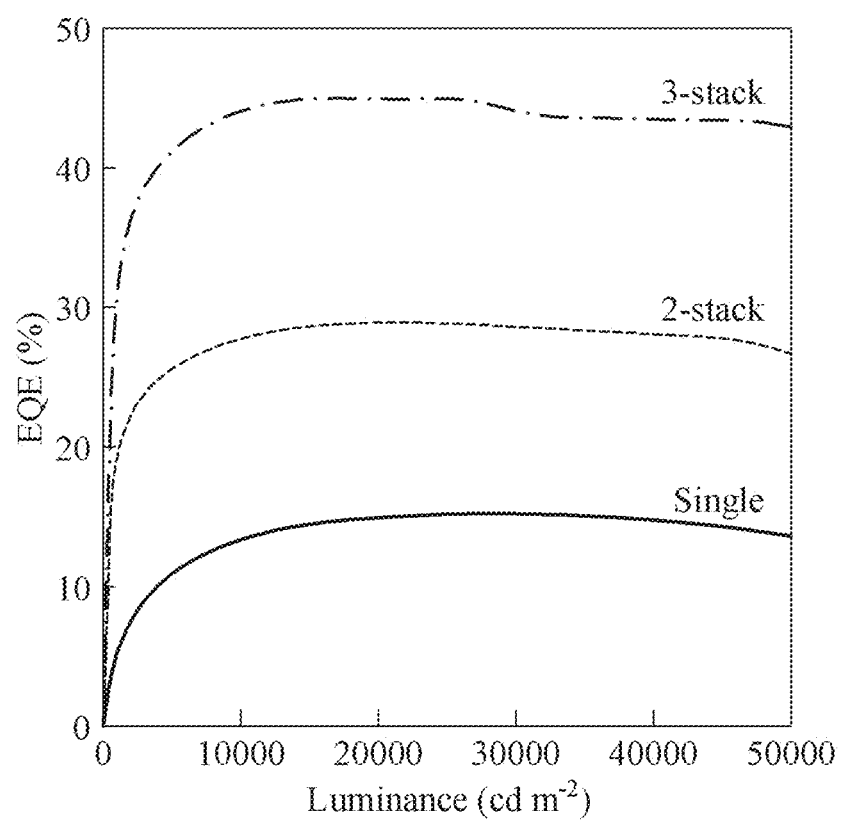
FIG. 11D is a graph showing an external quantum efficiency-luminance curve of a green LED and a multi-stacked green LED according to an embodiment.

FIG. 11A is a graph showing a current-voltage curve of a green LED and a multi-stacked green LED according to an embodiment, FIG. 11B is a graph showing a luminance-voltage curve of a green LED and a multi-stacked green LED according to an embodiment, FIG. 11C is a graph showing a current efficiency-luminance curve of a green LED and a multi-stacked green LED according to an embodiment, and FIG. 11D is a graph showing an EQE-luminance curve of a green LED and a multi-stacked green LED according to an embodiment.

Referring to FIGS. 11A to 11D, it can be seen that the operating voltage of Embodiment 5 and Embodiment 6 has a value greater by twice or three times than that of Embodiment 4 at a specific luminance value.

Embodiment 5 shows the high current efficiency of 93.42 cd/A and the high EQE of 28.94%, which are almost twice greater than the current efficiency of 50.20 cd/A and the EQE of 15.61% of Embodiment 4.

Further, Embodiment 6 shows the high current efficiency of 143.92 cd/A and the high EQE of 44.69%, which are greater by three times than those of Embodiment 4.

Since Embodiment 6 (3-stack) is implemented as three single LEDs each in which the CGJ layer using LZO/$Cu_2SnS_3$—$Ga_2O_3$ is formed, the above results may be achieved.

Also, it can be seen that current density and luminance values of Embodiment 5 and Embodiment 6 are greater than those of Embodiment 4.

Accordingly, it can be known that the charge transport efficiency of Embodiment 5 and Embodiment 6 in which a more number of CGJ layers are formed is greater than that of Embodiment 4.

Also, comparing data between Embodiment 5 and Embodiment 6, it can be seen that current density, luminance, current efficiency, and EQE values of Embodiment 6 (3-stack) are greater than those of Embodiment 5 (2-stack).

Through this, it can be known that the charge transport efficiency of Embodiment 6 in which a more number of CGJ layers are formed is greater than that of Embodiment 5.

Figure 12A:
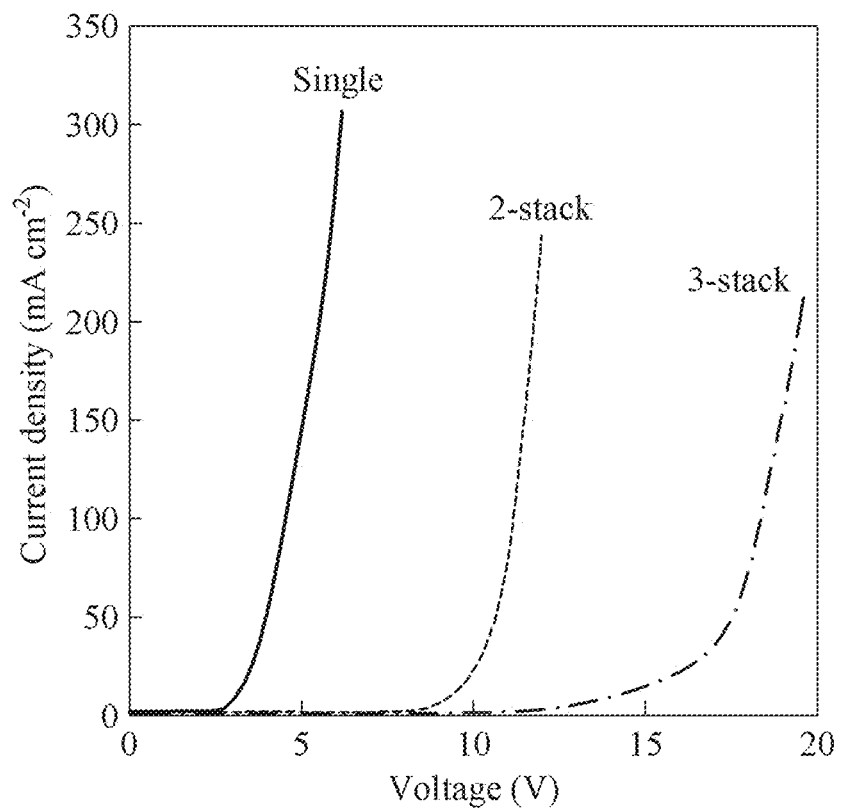
FIG. 12A is a graph showing a current-voltage curve of a red LED and a multi-stacked red LED according to an embodiment.
Figure 12B:
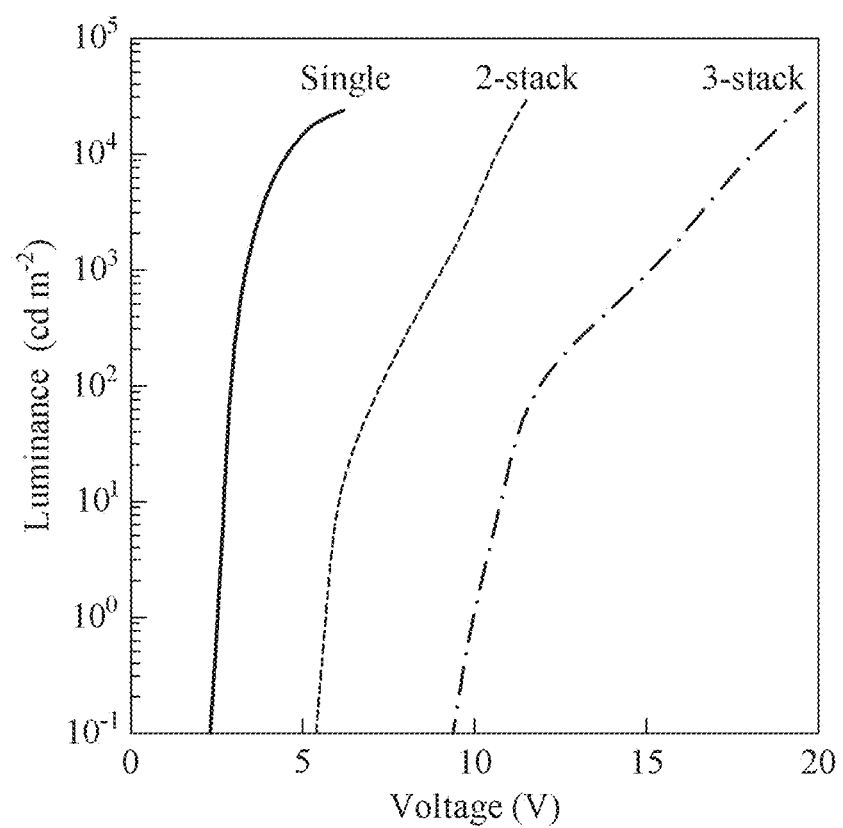
FIG. 12B is a graph showing a luminance-voltage curve of a red LED and a multi-stacked red LED according to an embodiment.
Figure 12D:
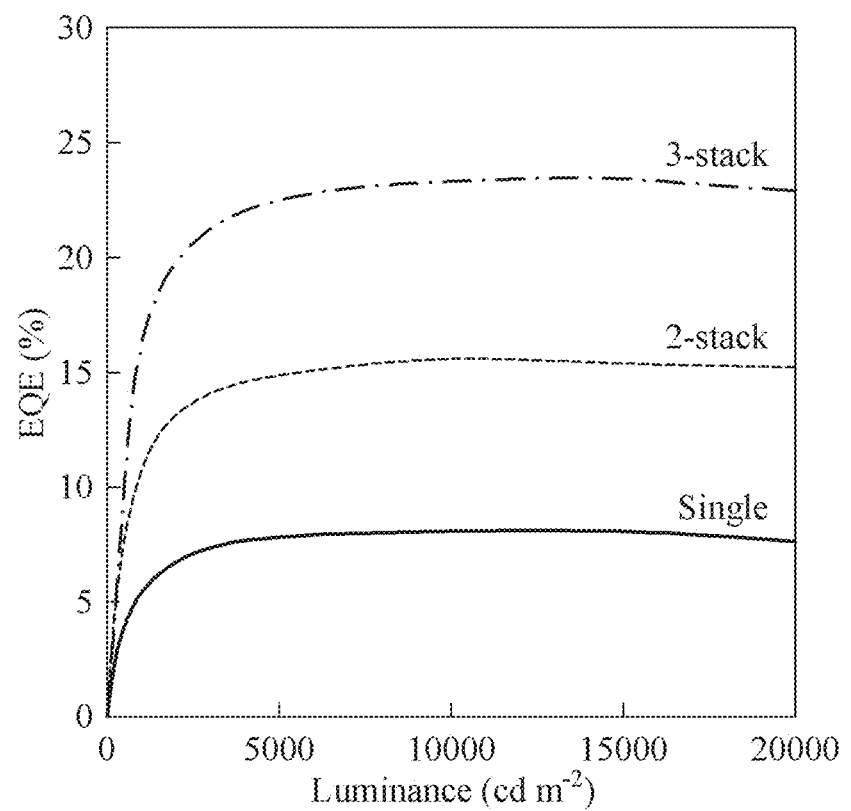
FIG. 12D is a graph showing an external quantum efficiency-luminance curve of a red LED and a multi-stacked red LED according to an embodiment.

FIG. 12A is a graph showing a current-voltage curve of a red LED and a multi-stacked red LED according to an embodiment, FIG. 12B is a graph showing a luminance-voltage curve of a red LED and a multi-stacked red LED according to an embodiment, FIG. 12C is a graph showing a current efficiency-luminance curve of a red LED and a multi-stacked red LED according to an embodiment, and FIG. 12D is a graph showing an EQE-luminance curve of a red LED and a multi-stacked red LED according to an embodiment.

Referring to FIGS. 12A to 12D, it can be seen that Embodiment 4 has a turn-on voltage value of 2.44 V, Embodiment 5 has a turn-on voltage value of 5.07 V, and Embodiment 6 has a turn-on voltage value of 8.12 V.

Also, it can be seen that Embodiment 4 has the maximum current efficiency of 11.44 cd/A, Embodiment 5 has the maximum current efficiency of 22.11 cd/A, and Embodiment 6 has the maximum current efficiency of 33.15 cd/A.

Also, it can be seen that Embodiment 5 and Embodiment 6 respectively have the maximum EQE of 15.57% and 23.34%, which are greater than 8.06% that is the maximum EQE of Embodiment 4.

Also, it can be seen that current density and luminance values of Embodiment 5 and Embodiment 6 are greater than those of Embodiment 4.

Accordingly, it can be known that the charge transport efficiency of Embodiment 5 and Embodiment 6 in which a more number of CGJ layers are formed is greater than that of Embodiment 4.

Also, comparing data between Embodiment 5 and Embodiment 6, it can be seen that current density, luminance, current efficiency, and EQE values of Embodiment 6 (3-stack) are greater than those of Embodiment 5 (2-stack).

Through this, it can be known that the charge transport efficiency of Embodiment 6 in which a more number of CGJ layers are formed is greater than that of Embodiment 5.

Accordingly, it can be known that the blue, green, and red multi-stacked LEDs according to FIGS. 10A to 10D, 11A to 11D, and 12A to 12D may achieve the excellent electrical performance through the high-efficiency charge generation and transport of the CGJ layer.

Figure 13A:
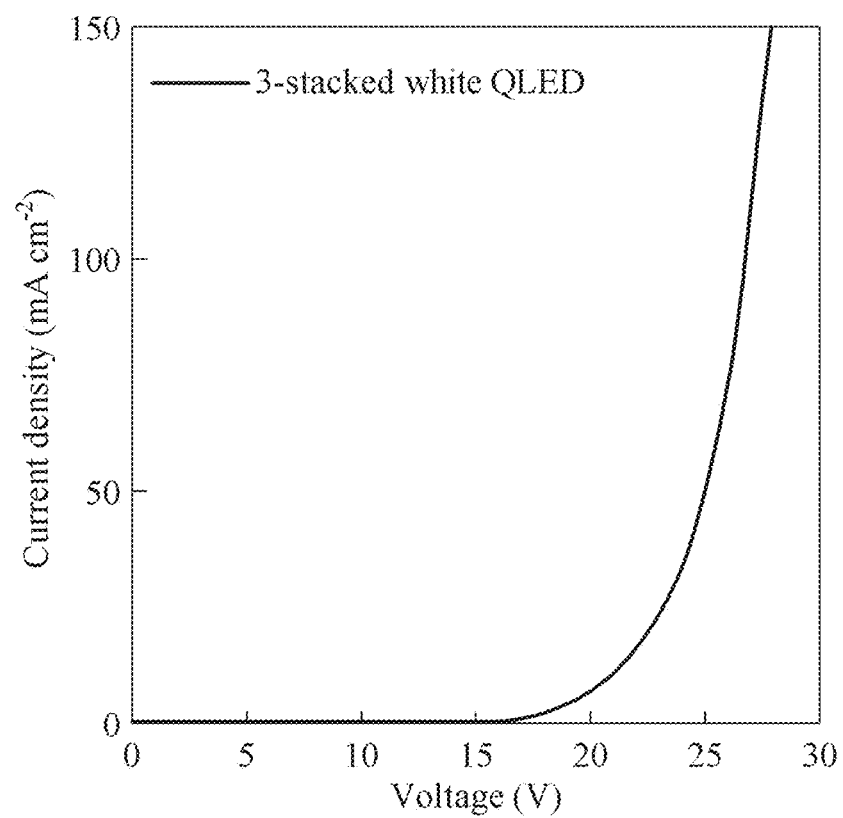
FIG. 13A is a graph showing a current-voltage curve of a multi-stacked white LED according to an embodiment.
Figure 13B:
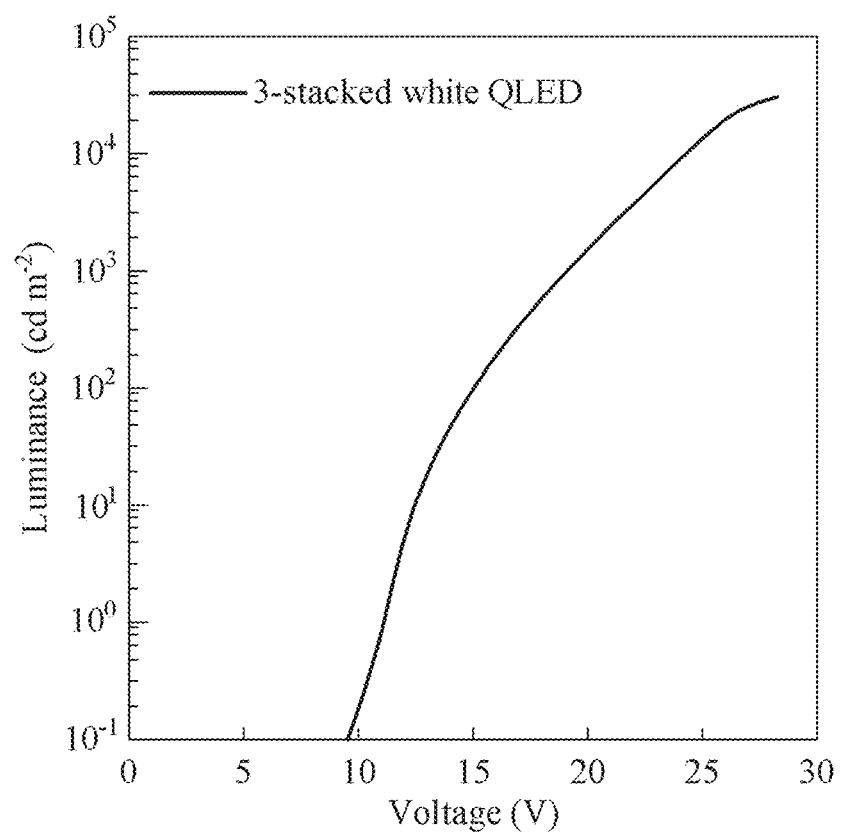
FIG. 13B is a graph showing a luminance-voltage curve of a multi-stacked white LED according to an embodiment.
Figure 13C:
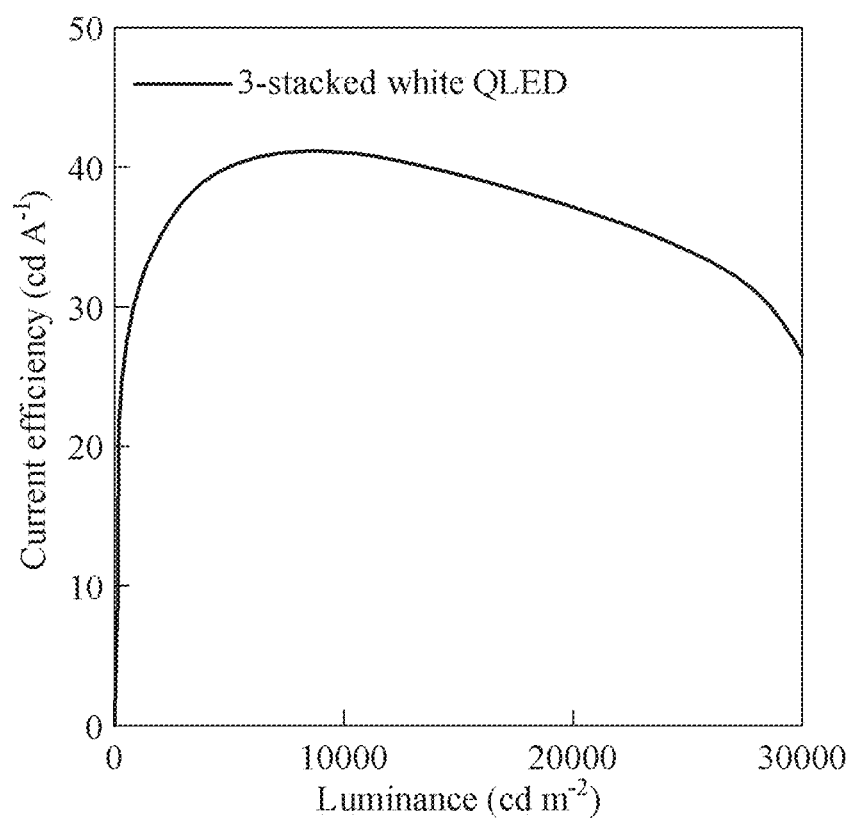
FIG. 13C is a graph showing a current efficiency-luminance curve of a multi-stacked white LED according to an embodiment.
Figure 13D:
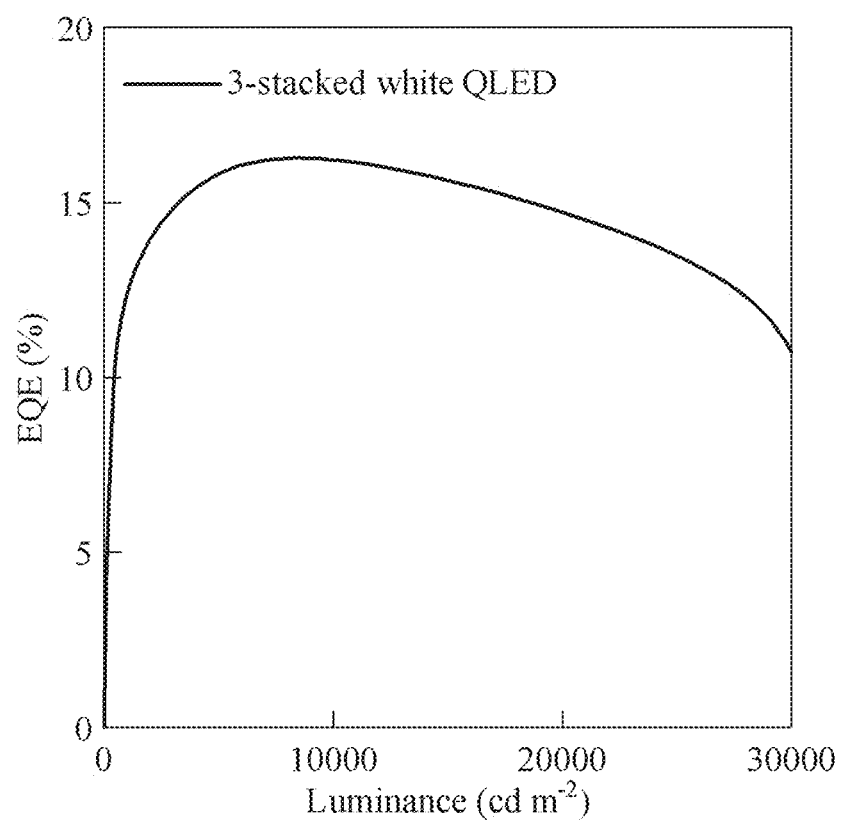
FIG. 13D is a graph showing an external quantum efficiency-luminance curve of a multi-stacked white LED according to an embodiment.

FIG. 13A is a graph showing a current-voltage curve of a multi-stacked white LED according to an embodiment, FIG. 13B is a graph showing a luminance-voltage curve of a multi-stacked white LED according to an embodiment, FIG. 13C is a graph showing a current efficiency-luminance curve of a multi-stacked white LED according to an embodiment, and FIG. 13D is a graph showing an EQE-luminance curve of a multi-stacked white LED according to an embodiment.

Referring to FIGS. 13A to 13D, it can be seen that white Embodiment 6 has a turn-on voltage value of 11.01 V, which is almost identical to a sum of turn-on voltage values of Embodiment 4 of blue, green, and red.

Through this, it can be known that the CGJ layer may effectively connect blue, green, and red EL units.

Due to such an efficient CGJ layer, Embodiment 6 may have very high current efficiency and EQE values of 41.15 cd/A and 16.32%.

Also, it can be seen that Embodiment 6 has the maximum luminance of 29,500 cd/m² at the operating voltage of 28 V.

Figure 14A:
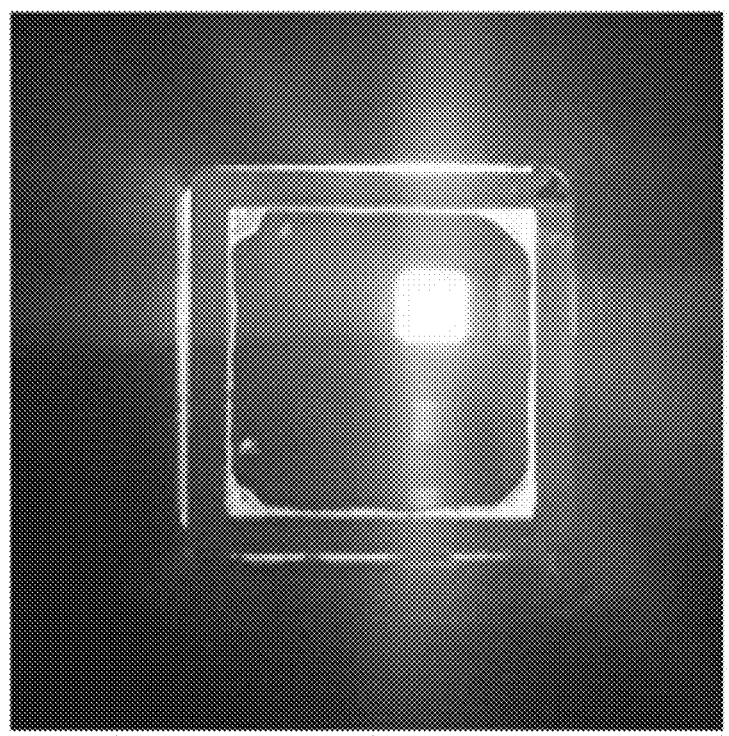
FIG. 14A is an image illustrating emission of a multi-stacked white LED according to an embodiment.
Figure 14B:
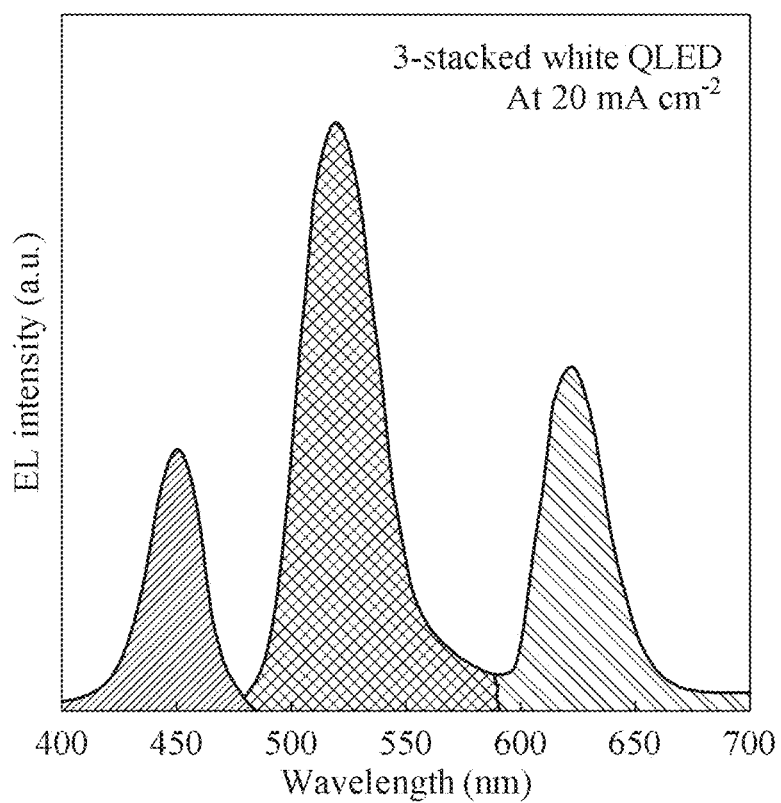
FIG. 14B is a graph showing an emission spectrum of a multi-stacked white LED according to an embodiment.

FIG. 14A is an image illustrating emission of a multi-stacked white LED according to an embodiment, and FIG. 14B is a graph showing an emission spectrum of a multi-stacked white LED according to an embodiment.

Referring to FIGS. 14A and 14B, it can be seen that Embodiment 6 (3-stacked white QLED) emits white light, a blue light emitting layer has a peak at 447 nm, a green light emitting layer has a peak at 522 nm, and a red light emitting layer has a peak at 625 nm.

Also, with respect to Embodiment 6, the blue, green, and red light emitting layers respectively have the full width at half maximum (FWHM) of 24 nm, 33 nm, and 28 nm.

Also, it can be seen that green light has relatively great EL intensity compared to that of red light and blue right if the luminance of Embodiment 6 is 20 mA/cm².

4. Electrical Properties of OLED

Figure 15A:
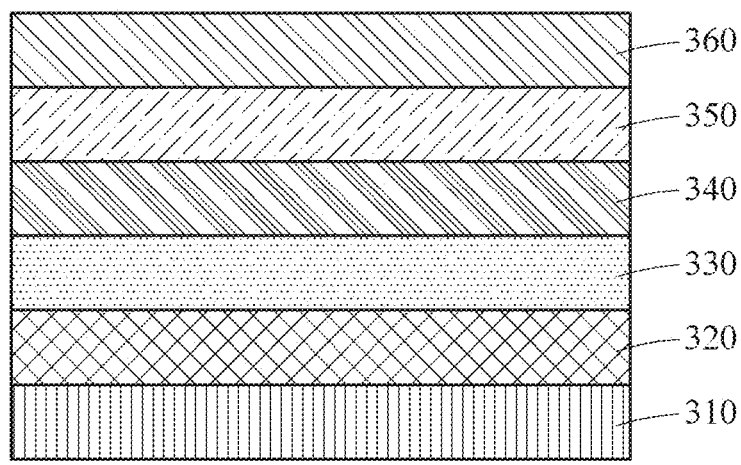
FIGS. 15A and 15B are cross-sectional views illustrating an LED (e.g., organic LED (OLED)) based on presence or absence of a CGJ layer according to a comparative example and an embodiment.
Figure 15B:
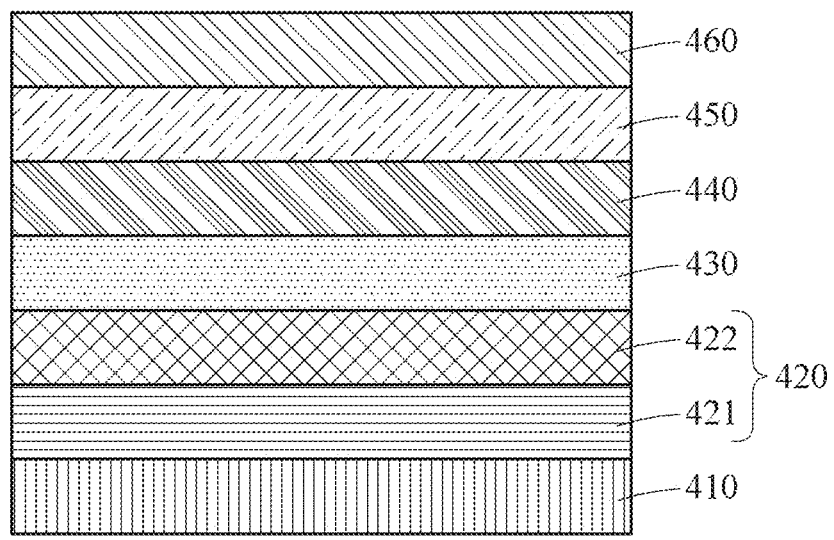
Figure 15C:
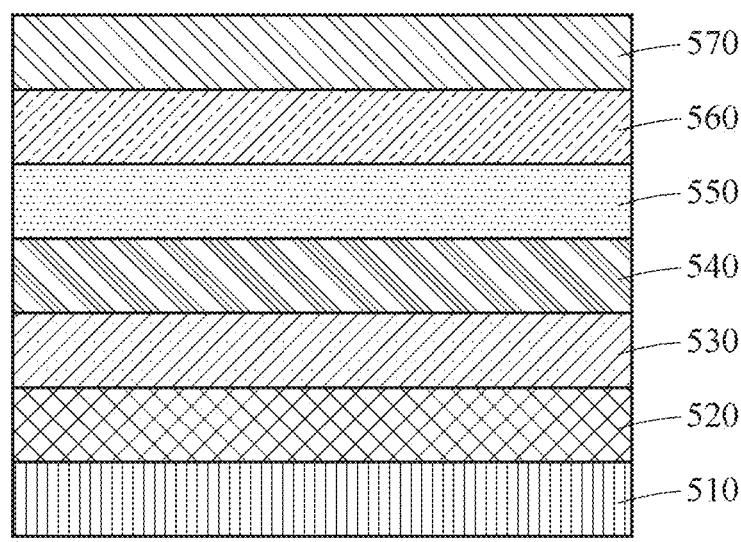
FIGS. 15C and 15D are cross-sectional views illustrating an inverted LED (e.g., OLED) based on presence or absence of a CGJ layer according to a comparative example and an embodiment.
Figure 15D:
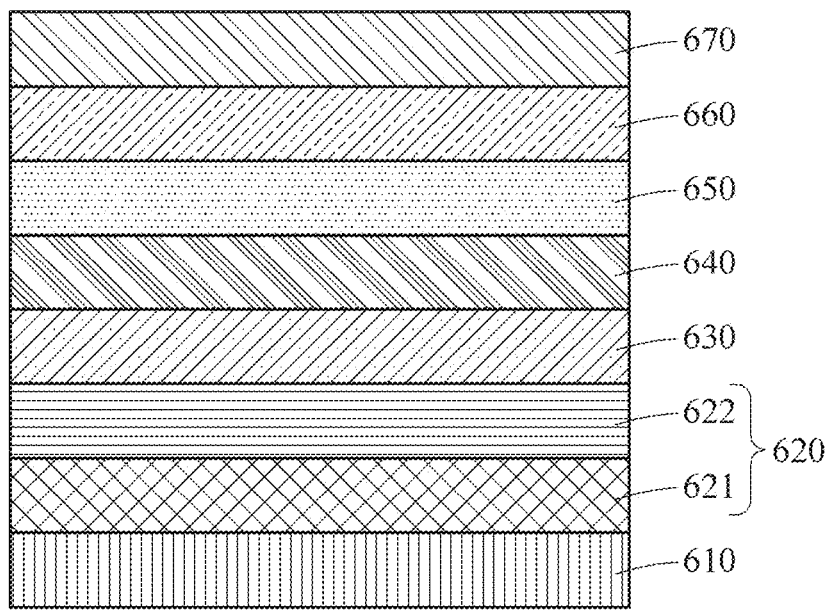

FIGS. 15A and 15B are cross-sectional views illustrating an LED (e.g., OLED) based on presence or absence of a CGJ layer according to a comparative example and an embodiment, and FIGS. 15C and 15D are cross-sectional views illustrating an inverted LED (e.g., OLED) based on a presence or absence of a CGJ layer according to a comparative example and an embodiment.

FIGS. 15A to 15D are cross-sectional views respectively illustrating detailed structures of Comparative example 1, Embodiment 7, Comparative example 2, and Embodiment 8.

Referring to FIGS. 15A to 15D, it can be seen that, in Comparative example 1, a hole injection layer 320 including a p-type oxide is provided, in Embodiment 7, a CGJ layer 420 is formed on an anode 410, in Comparative example 2, a hole injection layer 520 including an n-type oxide is provided, and, in Embodiment 8, a CGJ layer 620 is formed on an anode 610.

In detail, referring to FIG. 15A, an LED 300 of Comparative example 1 may include an anode 310, the hole injection layer 320, a hole transport layer 330, a light emitting layer 340, an electron transport layer 350, and a cathode 360.

Here, the LED 300 of Comparative example 1 may be manufactured by using ITO for the anode 310, $Cu_2SnS_3$—$Ga_2O_3$ for the hole injection layer 320, TCTA/NPB for the hole transport layer 330, TCTA:TPBi:Ir (ppy)$_3$ for the light emitting layer 340, TPBi for the electron transport layer 350, and LiF/Al for the cathode 360.

Referring to FIG. 15B, an LED 400 of Embodiment 7 may include the anode 410, the CGJ layer 420 including an n-type oxide 421 and a p-type oxide 422, a hole transport layer 430, a light emitting layer 440, an electron transport layer 450, and a cathode 460.

Referring to FIG. 15C, an LED 500 of Comparative example 2 may include an anode 510, the hole injection layer 520, a hole transport layer 530, a light emitting layer 540, an electron transport layer 550, an electron injection layer 560, and a cathode 570.

Referring to FIG. 15D, an LED 600 of Embodiment 8 may include the anode 610, the CGJ layer 620 including an n-type oxide 621 and a p-type oxide 622, a hole transport layer 630, a light emitting layer 640, an electron transport layer 650, an electron injection layer 660, and a cathode 670.

Hereinafter, the improvement in the electrical efficiency of an LED according to a CGJ layer formation will be described by comparing electrical properties between Comparative example 1 and Embodiment 7 and between Comparative example 2 and Embodiment 8.

Figure 16:
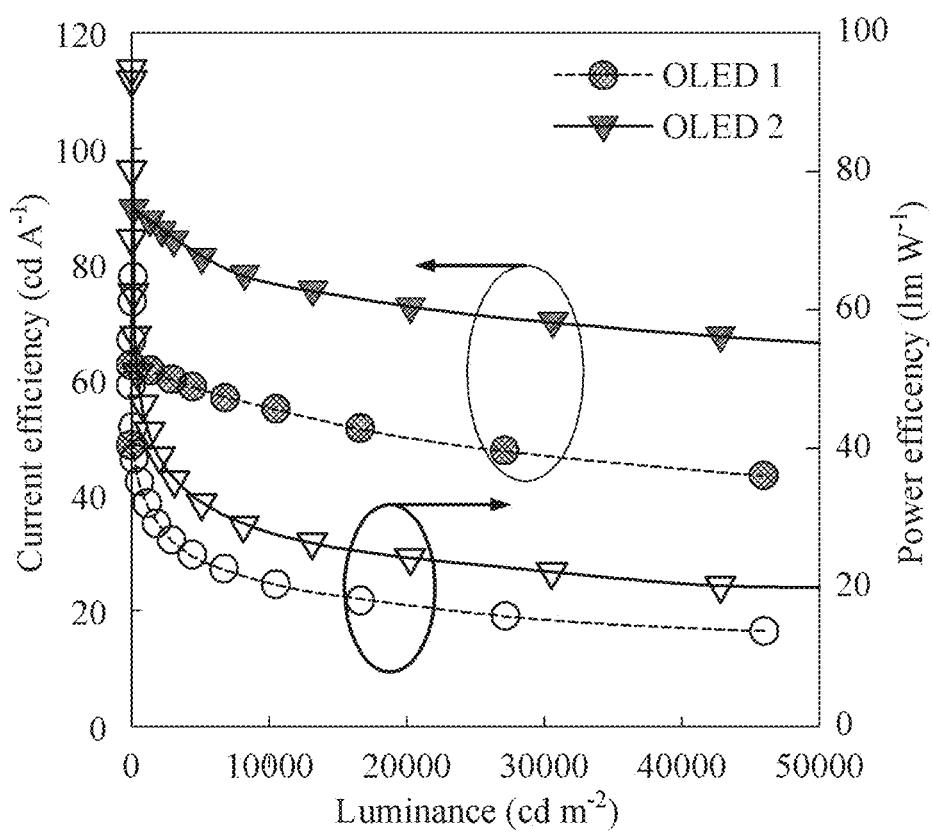
FIG. 16 is a graph showing current efficiency-luminance-power efficiency properties of an LED according to a comparative example and an embodiment.

FIG. 16 is a graph showing current efficiency-luminance-power efficiency properties of an LED according to a comparative example and an embodiment.

Referring to FIG. 16, it can be seen that current efficiency and power efficiency values of Embodiment 7 (OLED 2) are greater than those of Comparative example 1 (OLED 1).

Through this, the excellent charge generation and transport capability of the CGJ layer formed in Embodiment 7 may be verified.

Figure 17:
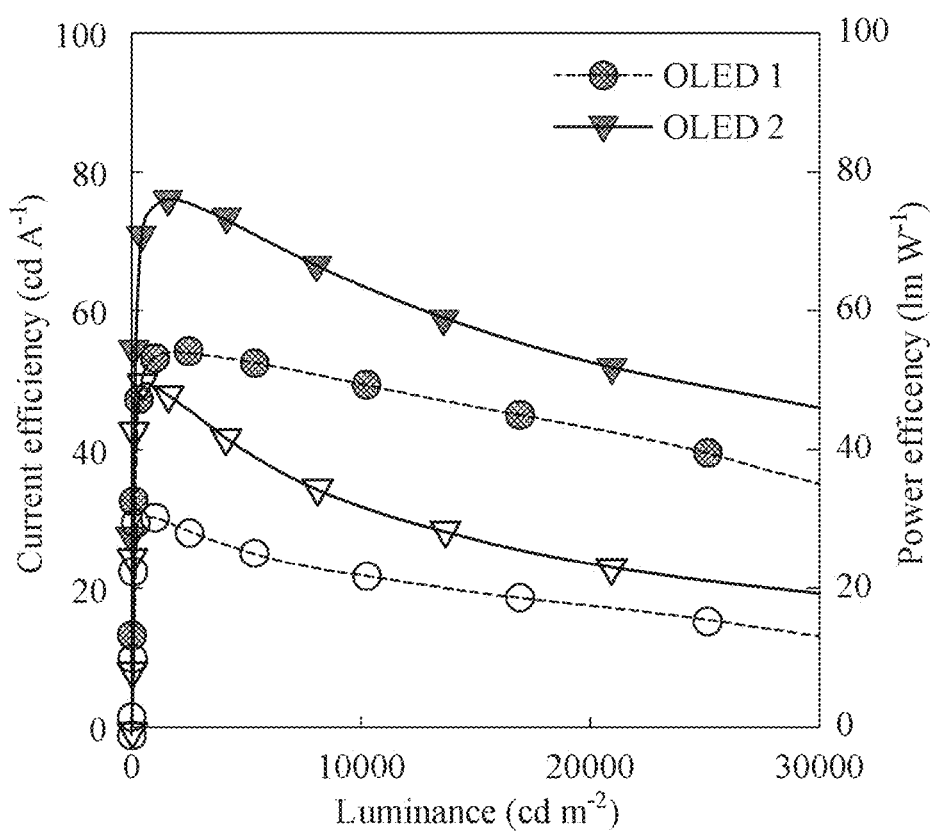
FIG. 17 is a graph showing current efficiency-luminance-power efficiency properties of an inverted LED according to a comparative example and an embodiment.

FIG. 17 is a graph showing current efficiency-luminance-power efficiency properties of an inverted LED according to a comparative example and an embodiment.

Referring to FIG. 17, it can be seen that current density, luminance, current efficiency and power efficiency values of Embodiment 8 (OLED 4) are greater than those of Comparative example 2 (OLED 3).

Through this, the excellent charge generation and transport capability of the CGJ layer formed in Embodiment 8 may be verified.

Also, a CGJ layer according to embodiments may apply to various types of LEDs, such as, for example, a QLED and an OLED, and may implement the excellent charge generation and transport capability.

While this disclosure includes specific embodiments, it will be apparent to those skilled in the art that various alterations and modifications in form and details may be made in these embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a light emitting device (LED), the method comprising:
    forming an anode on a substrate;
    forming a hole transport layer on the anode;
    forming a light emitting layer on the hole transport layer;
    forming a cathode on the light emitting layer; and
    forming a charge generation junction (CGJ) layer on at least one surface of the light emitting layer,
    wherein the CGJ layer is formed through film formation with a solution that includes an n-type oxide including zinc oxide (ZnO) and a p-type oxide represented by the following formula:

$$Cu_2Sn_{2-x}S_3\text{—}(Ga_x)_2O_3 \qquad \text{[Formula]}$$

where $0.2<x<1.5$.

2. The method of claim 1, wherein the CGJ layer is applied with heat treatment or ultraviolet (UV)/ozone treatment.

3. The method of claim 2, wherein the heat treatment is performed at 150° C. to 250° C.

4. The method of claim 2, wherein the heat treatment is performed for 10 minutes to 90 minutes.

5. The method of claim 2, wherein the UV/ozone treatment is performed for 30 seconds to 5 minutes.

* * * * *